US010573815B2

United States Patent
Takeda et al.

(10) Patent No.: US 10,573,815 B2
(45) Date of Patent: Feb. 25, 2020

(54) VAPOR DEPOSITION MASK, FRAME-EQUIPPED VAPOR DEPOSITION MASK, VAPOR DEPOSITION MASK PREPARATION BODY, AND METHOD FOR PRODUCING ORGANIC SEMICONDUCTOR ELEMENT

(71) Applicant: Dai Nippon Printing Co., Ltd., Tokyo (JP)

(72) Inventors: Toshihiko Takeda, Tokyo (JP); Hiroshi Kawasaki, Tokyo (JP); Katsunari Obata, Tokyo (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 0 days.

(21) Appl. No.: 15/313,359

(22) PCT Filed: May 29, 2015

(86) PCT No.: PCT/JP2015/065605
§ 371 (c)(1),
(2) Date: Nov. 22, 2016

(87) PCT Pub. No.: WO2015/186632
PCT Pub. Date: Dec. 10, 2015

(65) Prior Publication Data
US 2017/0148989 A1 May 25, 2017

(30) Foreign Application Priority Data

Jun. 6, 2014 (JP) .................................. 2014-117755
May 29, 2015 (JP) .................................. 2015-109699

(51) Int. Cl.
*H01L 51/00* (2006.01)
*C23C 16/04* (2006.01)
(Continued)

(52) U.S. Cl.
CPC ........ *H01L 51/0011* (2013.01); *C23C 14/042* (2013.01); *C23C 16/042* (2013.01)

(58) Field of Classification Search
CPC ............. H01L 51/0011; H01L 21/0332; C23C 14/042; C23C 14/04; B05B 12/20
See application file for complete search history.

(56) References Cited

U.S. PATENT DOCUMENTS

2002/0006555 A1* 1/2002 Hasegawa ................. G03F 1/56
430/5
2011/0207328 A1* 8/2011 Speakman .......... H01L 51/0011
438/694
(Continued)

FOREIGN PATENT DOCUMENTS

JP  2005-068501 A1  3/2005
JP  5288072 B2  9/2013
(Continued)

OTHER PUBLICATIONS

International Search Report and Written Opinion (Application No. PCT/JP2015/065605) dated Aug. 4, 2015.

*Primary Examiner* — Marcos D. Pizarro
*Assistant Examiner* — Antonio B Crite
(74) *Attorney, Agent, or Firm* — Burr & Brown, PLLC

(57) ABSTRACT

A vapor deposition mask capable of correctly performing confirmation of whether a shape pattern of openings formed in a resin mask is normal or similar confirmation while satisfying both high definition and lightweight, a vapor deposition mask preparation body for obtaining the vapor deposition mask, a frame-equipped vapor deposition mask including the vapor deposition mask, and a method for producing an organic semiconductor element using the frame-equipped vapor deposition mask. The aforementioned problem is solved by using, in a vapor deposition mask including a metal mask in which a slit is formed and a resin (Continued)

mask in which an opening corresponding to a pattern to be produced by vapor deposition is formed at a position overlapping with the slit, the metal mask and the resin mask being stacked, the resin mask which has about 40% or less of light ray transmittance at a wavelength of about 550 nm.

6 Claims, 9 Drawing Sheets

(51) Int. Cl.
      *C23C 14/04*       (2006.01)
      *C23C 14/24*       (2006.01)

(56) References Cited

U.S. PATENT DOCUMENTS

| | | |
|---|---|---|
| 2015/0037928 A1 | 2/2015 | Hirobe et al. |
| 2018/0214912 A1* | 8/2018 | Itoh .................. B05D 5/06 |

FOREIGN PATENT DOCUMENTS

| | | | | |
|---|---|---|---|---|
| JP | 2014098196 A | * | 5/2014 | ........... C23C 14/042 |
| JP | 2014098196 A | * | 5/2014 | ........... C23C 14/042 |
| WO | 2013/105642 A1 | | 7/2013 | |

* cited by examiner

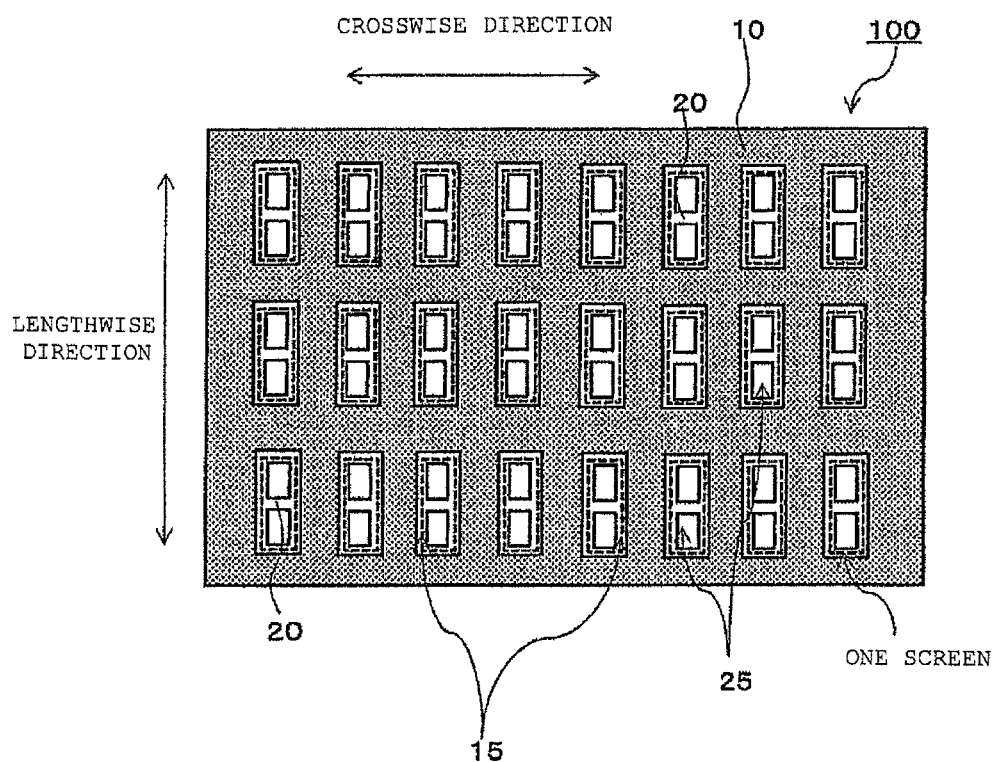

VIEW SEEN FROM RESIN MASK SIDE

VIEW SEEN FROM RESIN MASK SIDE

VAPOR DEPOSITION MASK, FRAME-EQUIPPED VAPOR DEPOSITION MASK, VAPOR DEPOSITION MASK PREPARATION BODY, AND METHOD FOR PRODUCING ORGANIC SEMICONDUCTOR ELEMENT

TECHNICAL FIELD

Embodiments of the present invention relate to a method for producing a vapor deposition mask, a frame-equipped vapor deposition mask, a vapor deposition mask preparation body, and an organic semiconductor element.

BACKGROUND ART

With upsizing of the products using organic EL elements or increase in substrate sizes, a demand for upsizing is also growing with respect to vapor deposition masks, and the metal plates for use in production of the vapor deposition masks constituted of metals are also upsized. However, with the present metal processing technique, it is difficult to form openings in a large metal plate with high precision, which cannot respond to enhancement in definition of the openings. Moreover, in the case of a vapor deposition mask constituted of only a metal, the mass thereof also increases with upsizing, and the total mass including a frame also increases, which becomes a hindrance to handling.

Under such circumstances, in Patent Document 1, there is proposed a vapor deposition mask including a metal mask in which slits are provided and a resin mask which is positioned on the surface of the metal mask and in which openings corresponding to a pattern to be produced by vapor deposition are arranged for a plurality of rows in the lengthwise direction and in the crosswise direction, the metal mask and the resin mask being stacked. The vapor deposition mask proposed in Patent Document 1 is regarded as being capable of satisfying both high definition and lightweight in upsizing, and moreover, forming a vapor deposition pattern with high definition.

CITATION LIST

Patent Document

Patent Document 1: Japanese Patent No. 5288072

SUMMARY

Technical Problem

A primary object of an embodiment of the present invention is to provide a vapor deposition mask capable of correctly performing inspection of whether or not a shape pattern of openings formed in a resin mask is normal while satisfying both high definition and lightweight, to provide a vapor deposition mask preparation body for obtaining the vapor deposition mask, to provide a frame-equipped vapor deposition mask including the vapor deposition mask, and further, to provide a method for producing an organic semiconductor element using the frame-equipped vapor deposition mask.

Solution to Problem

In order to solve the aforementioned problem, there is provided a vapor deposition mask according to an embodiment of the present invention, including: a metal mask in which a slit is formed; and a resin mask in which an opening corresponding to a pattern to be produced by vapor deposition is formed at a position overlapping with the slit, the metal mask and the resin mask being stacked, wherein the resin mask has about 40% or less of light ray transmittance at a wavelength of about 550 nm.

In the aforementioned embodiment of the invention, the resin mask preferably contains a color material component. Moreover, a thickness of the resin mask is preferably about 3 µm or more and less than about 10 µm.

Moreover, in order to solve the aforementioned problem, there is provided a frame-equipped vapor deposition mask according to an embodiment of the present invention, constituted by fixing a vapor deposition mask onto a frame, wherein the vapor deposition mask includes a metal mask in which a slit is formed and a resin mask in which an opening corresponding to a pattern to be produced by vapor deposition is formed at a position overlapping with the slit, the metal mask and the resin mask being stacked, and the resin mask has about 40% or less of light ray transmittance at a wavelength of about 550 nm.

Moreover, in order to solve the aforementioned problem, there is provided a vapor deposition mask preparation body for obtaining a vapor deposition mask according to an embodiment of the present invention, the vapor deposition mask including a metal mask in which a slit is formed and a resin mask in which an opening corresponding to a pattern to be produced by vapor deposition is formed at a position overlapping with the slit, the metal mask and the resin mask being stacked, wherein the metal mask in which the slit is provided is stacked on one surface of a resin plate, and the resin plate has about 40% or less of light ray transmittance at a wavelength of about 550 nm.

Moreover, in order to solve the aforementioned problem, there is provided a method for producing an organic semiconductor element according to an embodiment of the present invention, including a step of forming a vapor deposition pattern on a vapor deposition target using a frame-equipped vapor deposition mask in which a vapor deposition mask is fixed to a frame, wherein in the step of forming the vapor deposition pattern, the vapor deposition mask fixed to the frame includes a metal mask in which a slit is formed and a resin mask in which an opening corresponding to a pattern to be produced by vapor deposition is formed at a position overlapping with the slit, the metal mask and the resin mask being stacked, and further, the resin mask has about 40% or less of light ray transmittance at a wavelength of about 550 nm.

Advantageous Effects

According to the vapor deposition mask and the frame-equipped vapor deposition mask of an embodiment of the present invention, while satisfying both high definition and lightweight, inspection of whether or not a shape pattern of openings formed in a resin mask is normal can be correctly performed. Moreover, according to a vapor deposition mask preparation body of an embodiment of the present invention, the vapor deposition mask described above can be simply produced. Moreover, according to the method for producing an organic semiconductor element of an embodiment of the present invention, organic semiconductor elements can be produced with high precision.

BRIEF DESCRIPTION OF DRAWINGS

FIG. 4 is an elevation view of the vapor deposition mask of Embodiment (A) seen from the metal mask side.

DESCRIPTION OF EMBODIMENTS

<<Vapor Deposition Mask>>

Figure 1A:
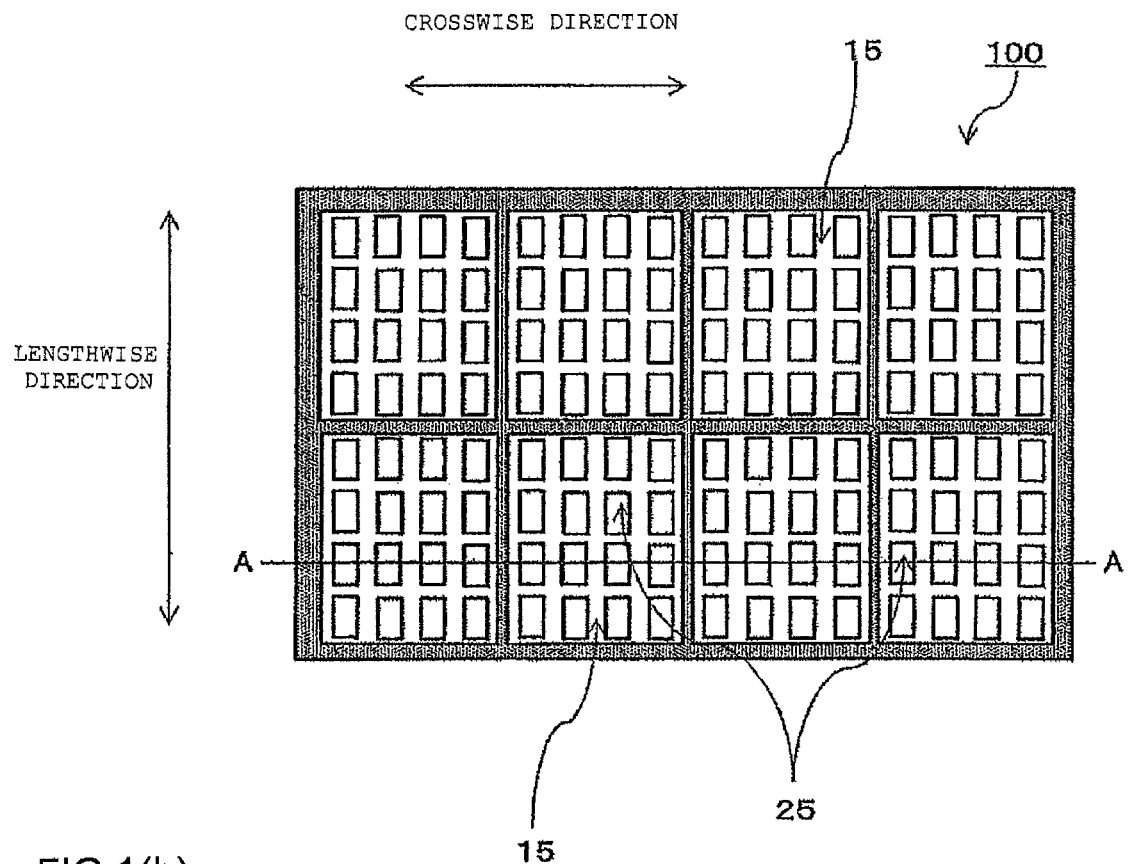
FIG. 1 Portion (a) is an elevation view of the vapor deposition mask of an embodiment as seen from a metal mask side and portion (b) is a cross-sectional view taken along the line A-A in portion (a).
Figure 1B:
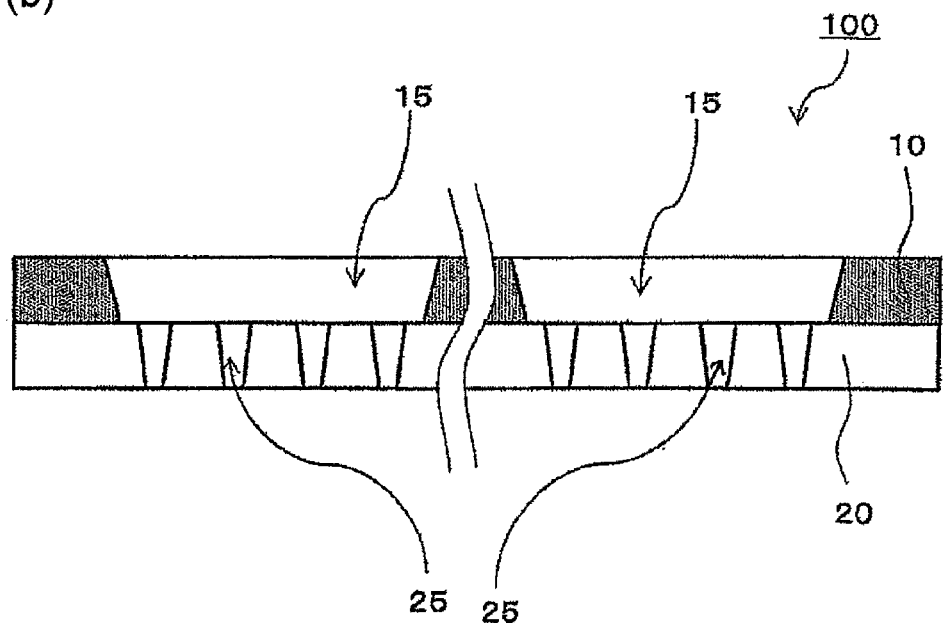

Hereafter, a vapor deposition mask 100 of an embodiment of the present invention is specifically described. As shown in FIG. 1, the vapor deposition mask 100 of an embodiment includes a metal mask 10 in which a slit 15 is formed and a resin mask 20 in which an opening 25 corresponding to a pattern to be produced by vapor deposition is formed at a position overlapping with the slit 15, the metal mask and the resin mask being stacked. FIG. 1(a) is an elevation view of a vapor deposition mask of an embodiment as seen from the metal mask 10 side and FIG. 1(b) is a schematic cross-sectional view taken along the line A-A in FIG. 1(a).

(Resin Mask)

As shown in FIG. 1, a plurality of openings 25 are provided in the resin mask 20. Further, the vapor deposition mask 100 of an embodiment of the present invention is characterized in that the resin mask 20 has about 40% or less of light ray transmittance at a wavelength of about 550 nm.

When the vapor deposition pattern is produced on a vapor-deposited surface of a vapor deposition target using the vapor deposition mask 100 of an embodiment, this is performed in the state where the vapor-deposited surface of the vapor deposition target is opposed to the surface on the resin mask side of the vapor deposition mask 100, and the vapor-deposited surface of the vapor deposition target is in close contact with the resin mask 20 of the vapor deposition mask. Then, a vapor deposition material released from a vapor deposition source is caused to pass through the openings 25 formed in the resin mask 20 and to stick to the vapor-deposited surface of the vapor deposition target, and thereby, the vapor deposition pattern corresponding to the openings 25 formed in the resin mask 20 is produced on the vapor-deposited surface of the vapor deposition target. Notably, a vapor deposition method using the vapor deposition mask of an embodiment is not limited at all but, for example, physical vapor deposition (Physical Vapor Deposition) such as a sputtering method, a vacuum vapor deposition method, ion plating and an electron beam vapor deposition method, chemical vapor deposition (Chemical Vapor Deposition) such as thermal CVD, plasma CVD and photo-induced CVD methods, and the like can be cited.

In other words, in the aforementioned method for producing the vapor deposition pattern on the vapor-deposited surface of the vapor deposition target, the vapor deposition pattern formed on the vapor-deposited surface of the vapor deposition target is to be determined by the opening pattern of the openings 25 formed in the resin mask 20. As a result, it is important that in the resin mask 20 of the vapor deposition mask 100, the opening pattern of the openings 25 is formed to meet the vapor deposition pattern the formation of which is desired on the vapor-deposited surface of the vapor deposition target, and it is required that before use of the vapor deposition mask, that is, after production of the vapor deposition mask, whether or not the opening pattern of the openings 25 formed in the resin mask 20 of the vapor deposition mask 100 is formed to meet the vapor deposition pattern the formation of which is desired on the vapor-deposited surface of the vapor deposition target is inspected.

As one of inspection methods for determining whether or not the opening pattern of the openings 25 formed in the resin mask 20 of the vapor deposition mask 100 meets the vapor deposition pattern the formation of which is desired on the vapor-deposited surface of the vapor deposition target, there is a method of irradiating the resin mask 20 with visible light to inspect the opening pattern formed in the resin mask 20 with shade formed by a region which transmits the visible light and a region which does not transmit or hardly transmits it in the resin mask 20. Specifically, it is a method in which the resin mask 20 is irradiated from the side of the surface, of the resin mask 20, that is not in contact with the metal mask 10 with visible light, and the transmitted light is imaged from the side of the surface, of the metal mask 10, that is not in contact with the resin mask 20 by a camera, or the resin mask 20 is irradiated from the side of the surface, of the metal mask 10, that is not in contact with the resin mask 20 with visible light, and the transmitted light is imaged from the side of the surface, of the resin mask 20, that is not in contact with the metal mask 10 by a camera to inspect the opening pattern formed in the resin mask 20 with shade originated from the imaged transmitted light.

When inspecting the opening pattern as mentioned above, in the case where the mask in which the openings are formed is a mask constituted of a metal material that does not transmit visible light, the contrast in tone of shade of the opening pattern of the openings formed in the mask is high, and the opening pattern can be inspected without any problem. On the other hand, in the case where the mask in which the openings are formed is a mask constituted of a resin material that transmits visible light, the contrast in tone of shade of the opening pattern of the openings formed in the mask is low, and there is to arise a problem that the opening pattern cannot be sufficiently inspected. In other words, the vapor deposition mask which has a configuration in which the metal mask 10 in which the slit 15 is formed is stacked on the resin mask 20 in which the openings 25 corresponding to a pattern to be produced by vapor deposition are formed at a position overlapping with the slit 15 and can satisfy both high definition and lightweight is to include a problem that the opening pattern of the openings formed in the resin mask cannot be correctly inspected. However, in the aforementioned vapor deposition mask capable of satisfying both high definition and lightweight, the transmittance of visible light in the occasion when the resin mask 20 is irradiated with the visible light, specifically, the transmittance of visible light in a region in which the openings 25 of the resin mask 20 are not formed (hereinafter sometimes referred to as region not formed with openings) has not been currently considered at all. In order to enhance the contrast in tone of shade originated from the imaged transmitted light, it is desirable that only the openings 25 of the resin mask 20 transmit visible light, and the region not formed with openings in the resin mask 20 does not transmit the visible light or has low transmittance thereof. However, with a conventional resin mask in which the transmittance of visible light is not considered at all, the visible light is transmitted also in the region not formed with openings in the resin mask, the contrast in tone of shade imaged by a camera is low, and it is difficult to correctly grasp the edge part of the shade, in other words, the edge part in the opening pattern of the openings 25 formed in the resin mask 20. When the edge part cannot be correctly grasped, it is difficult to inspect whether or not the opening pattern of the openings 25 formed in the resin mask 20 of the vapor deposition mask 100 meets the vapor deposition pattern the formation of which is desired on the vapor-deposited surface of the vapor deposition target.

The vapor deposition mask 100 of an embodiment of the present invention is characterized in that the resin mask 20 has about 40% or less of light ray transmittance at a wavelength of about 550 nm. According to the vapor deposition mask 100, when the resin mask 20 is irradiated with visible light, the visible light can be suppressed from being transmitted through the region not formed with openings in the resin mask 20, the contrast in tone of shade imaged by a camera can be enhanced, and the edge part of the shade, in other words, the edge part in the opening pattern of the openings 25 formed in the resin mask 20 can be correctly grasped. In this way, it can be determined whether or not the opening pattern of the openings 25 formed in the resin mask 20 of the vapor deposition mask 100 meets the vapor deposition pattern the formation of which is desired on the vapor-deposited surface of the vapor deposition target. In particular, according to the vapor deposition mask of an embodiment of the present invention, since the openings 25 are formed in the mask constituted of a resin material, the openings 25 in the relevant mask can be in high definition. In general, along with progress of high definition of the openings 25, the contrast in tone of shade imaged tends to be lower. As mentioned above, in an embodiment of the present invention, since the resin mask 20 is defined to have about 40% or less of light ray transmittance at a wavelength of about 550 nm, the contrast in tone of shade can be sufficiently enhanced. Accordingly, even in the case of the high definition openings 25, for example, even in the case of setting the resin mask in which the high definition openings 25 exceeding 400 ppi are formed, the opening pattern of the openings 25 can be correctly inspected.

The light ray transmittance of the resin mask 20 stated in the specification of the present application means the transmittance of light transmitted through the region not formed with openings which is a region in which the openings 25 are not formed in the resin mask 20.

The light ray transmittance of visible light can be measured using a spectrometer (MPC-3100, Shimadzu Corporation) or the like.

The reason that in the vapor deposition mask 100 of an embodiment of the present invention, the resin mask 20 is defined to have about 40% or less of light ray transmittance at a wavelength of about 550 nm is that a wavelength of about 550 nm is a substantial center wavelength of visible light, and by setting the light ray transmittance at a wavelength of about 550 nm to be about 40% or less, the contrast in tone of shade imaged by irradiation with the visible light can be sufficiently enhanced. More specifically, since a spectrum of a transmission light source which is incident light, for example, a spectrum of a white light source includes a wavelength of about 550 nm which is a substantial center wavelength of visible light, by setting the light ray transmittance at a wavelength of about 550 nm to be about 40% or less, the contrast in tone of shade imaged can be sufficiently enhanced. Notably, when the light ray transmittance at a wavelength of about 550 nm exceeds about 40%, the contrast in tone of shade in the occasion of irradiation with visible light cannot be sufficiently enhanced, and the edge part of the shade cannot be correctly grasped. While the light ray transmittance at a wavelength of about 550 nm only has to satisfy the condition that it is about 40% or less as mentioned above, it is preferably about 30% or less, still preferably about 10% or less. The lower limit value thereof is not specially limited but 0%. In particular, when the light ray transmittance at a wavelength of about 550 nm is set to be about 10% or less, since the contrast in tone of shade can be more sufficiently enhanced, inspection precision can be further improved.

Furthermore, it is preferable to set the resin mask to have about 40% or less of light ray transmittance at a wavelength of about 550 nm and about 55% or less of maximum value of the light ray transmittance at about 450 nm to 650 nm of wavelength, in particular, the resin mask to have about 40% or less of light ray transmittance at a wavelength of about 550 nm and about 55% or less of maximum value of the light ray transmittance at about 380 nm to 780 nm of wavelength. Moreover, it is still preferable to set the resin mask to have about 40% or less of maximum value of the light ray transmittance at about 450 nm to 650 nm of wavelength, in particular, at about 380 nm to 780 nm of wavelength. Moreover, it is further preferable to set the resin mask to have about 40% or less of light ray transmittance at a wavelength of about 550 nm and about 55% or less of maximum value of the light ray transmittance in the visible light wavelength region, and it is particularly preferable to set the resin mask to have about 40% or less of maximum value of the light ray transmittance in the visible light wavelength region. The resin mask most preferably has about 10% or less of maximum value of the light ray transmittance at about 450 nm to 650 nm, and in particular, about 10% or less of maximum value of the light ray transmittance at about 380 nm to 780 nm of wavelength, or the resin mask to have about 10% or less of maximum value of the light ray transmittance in the visible light wavelength region. The visible light wavelength region stated here means the wavelength range defined by JIS-Z8120(2001), and its short wavelength limit is about 360 to 400 nm and its long wavelength limit is about 760 to 830 nm. By setting, not only the light ray transmittance at a wavelength of about 550 nm, but also the light ray transmittance at about 380 nm to 780 nm of wavelength or in the visible light wavelength region to be within the aforementioned preferable range, deviation of the contrast in tone of shade can be suppressed across wide wavelengths and the contrast in tone of shade can be further enhanced.

The material of the resin mask 20 is not limited but, for example, a material that enables formation of the opening 25 with high definition by laser processing or the like, has a low rate of dimensional change and a low rate of humidity absorption under heat and with passage of time, and is light weight, is preferably used. As such materials, a polyimide resin, a polyamide resin, a polyamide-imide resin, a polyester resin, a polyethylene resin, a polyvinylalcohol resin, a polypropylene resin, a polycarbonate resin, a polystyrene resin, a polyacrylonitrile resin, an ethylene-vinyl acetate copolymer resin, an ethylene-vinylalcohol copolymer resin, an ethylene-methacrylic acid copolymer resin, a polyvinyl chloride resin, a polyvinylidene chloride resin, cellophane, an ionomer resin and the like can be cited. Among the materials shown above by way of example, the resin materials with the thermal expansion coefficients of about 16 ppm/° C. or less are preferable, the resin materials with the rates of humidity absorption of about 1.0% or less are preferable, and the resin materials including both conditions are particularly preferable. The resin mask using these resin materials enables dimensional precision of the openings 25 to be improved and a rate of dimensional change and a rate of humidity absorption under heat and with passage of time to be small. From among the materials of the resin mask exemplarily presented above, the particularly preferable material is polyimide resin.

Figure 8A:
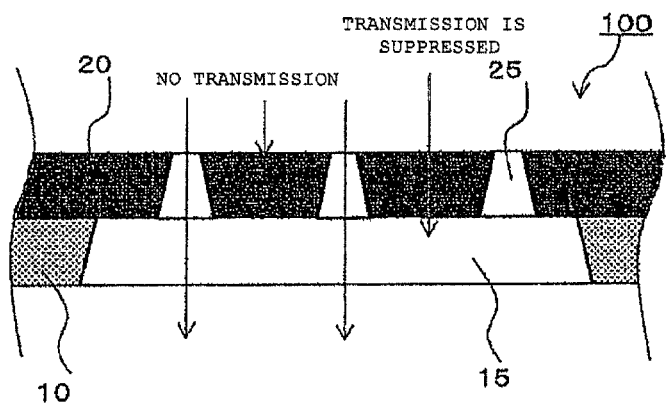
FIG. 8 Each of portions (a) to (d) is a schematic cross-sectional view, of the vapor deposition mask, schematically showing a state of transmitted light being transmitted through the resin mask. Each of portions (a) to (c) is for a vapor deposition mask of an embodiment. Portion (d) is for a comparative vapor deposition mask.
Figure 8B:
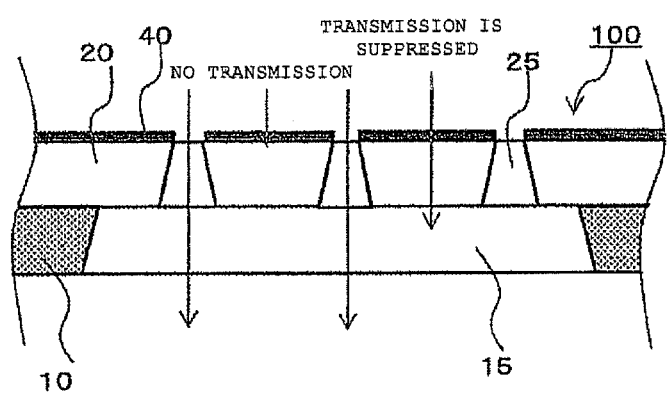
Figure 8C:
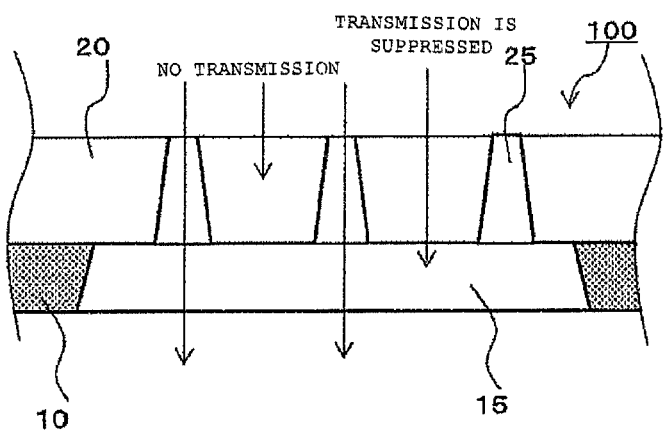
Figure 8D:
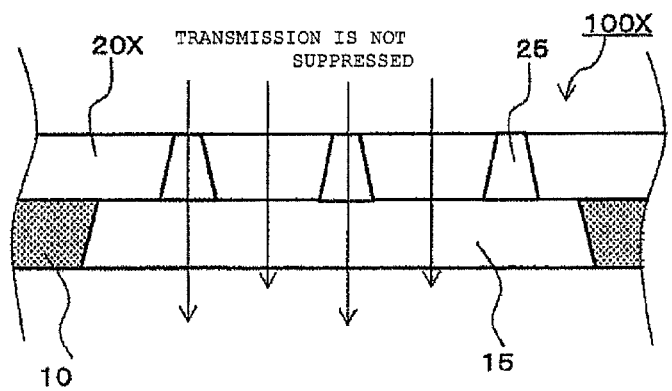

In the resin mask 20 constituted of the material exemplarily presented above and the like, a device to set the resin mask 20 to have about 40% or less of light ray transmittance at a wavelength of about 550 nm is not specially limited but, for example, the resin mask 20 can be realized by setting it to have configurations of a first device to a third device below. Notably, the resin mask 20 is not limited to the configurations described below but the resin mask 20 only eventually has to have about 40% or less of light ray transmittance at a wavelength of about 550 nm. As shown in FIGS. 8(a) to 8(c), according to each device described below, visible light can be caused not to be transmitted through the region not formed with openings in the resin mask 20 or to be suppressed from being transmitted therethrough, and the contrast in tone of shade can be sufficiently enhanced. On the other hand, as shown in FIG. 8(d), with a conventional vapor deposition mask 100X, visible light tends to be transmitted through the region not formed with openings in the resin mask 20X, and the contrast in tone of shade cannot be sufficiently enhanced.

(First Device)

As shown in FIG. 8(a), the first device is a device to cause the resin mask 20 constituted of the material exemplarily presented above and the like to contain a color material component and to set the light ray transmittance at a wavelength of about 550 nm to be about 40% or less. In other words, the resin mask 20 in the first device contains the color material component along with the material exemplarily presented above and the like. The color material component is not specially limited but the material and the content with which the resin mask 20 can have about 40% or less of light ray transmittance at a wavelength of about 550 nm only have to be properly selected. The color material component may be an organic material or may be an inorganic material, and conventionally known dyes and pigments, fine particles of these, and the like can be properly selected and used. Moreover, ones other than these can also be used as long as the resin mask 20 can be set to have about 40% or less of light ray transmittance at a wavelength of about 550 nm. One kind of color material component may be solely used or two or more kinds thereof may also be simultaneously used. Moreover, the color material component contained in the resin mask 20 only has to be selected with a process temperature and the like in the occasion when the resin mask 20 or a resin plate mentioned later is formed taken into consideration. For example, when polyimide resin is used as the material of the resin mask, it is preferable to use a color material component with high heat resistance. The shape of the color material component is not specially limited but particles in a conventionally known shape such, for example, as a spherical shape, a needle shape and a scale shape may be used, and moreover, the dimension thereof is also not specially limited. Notably, when the dimension of the color material component exceeds about 1 μm, in the case of setting the resin mask 20 containing the color material component, defects such as projections tend to arise. With this point taken into consideration, the dimension of the color material component is preferably about 1 μm or less. The lower limit value of the dimension is not specially limited but about 1 nm.

As examples of the color material component, for example, carbon black, titanium oxide, titanium dioxide, black iron oxide, yellow iron oxide, red iron oxide, manganese oxide, manganese dioxide, chromium oxide, chromium dioxide, silicon oxide, silicon dioxide, ultramarine, aniline black, activated carbon and the like can be cited. Notably, as the content of the color material component becomes more, the strength of the resin mask tends to decrease more, and in a vapor deposition step of producing a vapor deposition pattern on a vapor-deposited surface of a vapor deposition target using the vapor deposition mask and in a cleaning step of cleaning the vapor deposition mask, durability of use tends to decrease more. Accordingly, for the color material component, it is preferable to reduce the content of the color material component by using a shape and a material with which light shielding ability is enhanced. The color material component is preferably black and small in wavelength dependency. From among the color material components exemplarily presented above, carbon black, black iron oxide, titanium oxide and titanium dioxide are the particularly preferable color material components. The content of the color material component is preferably about 20 mass % or less to the total mass of the resin material of the resin mask, still preferably about 10 mass % or less, particularly preferably about 6 mass % or less. The reason is that when the content of the color material component to the total mass of the resin material of the resin mask 20 exceeds about 20 mass %, dispersity of the color material component in the resin mask 20 becomes uneven, the number of defects in the resin mask 20 containing the color material component increases, and the strength of the resin mask deteriorates.

Moreover, the resin mask 20 in the first device may contain any components as well as the aforementioned material of the resin mask and the color material component. For example, a component, such as a dispersant, needed for forming the resin mask in the first device can be arbitrarily blended. The same holds true for a color material layer 40 in the resin mask 20 in the second device mentioned later.

The thickness of the resin mask 20 in the first device is not specially limited but, in the case of further improving the effect of suppressing generation of a shadow, the thickness of the resin mask 20 is preferably less than about 10 μm. A preferable range of the lower limit value is not specially limited but, in the case where the thickness of the resin mask 20 is less than about 3 μm, defects such as a pinhole tend to arise and a risk of deformation or the like increases. In particular, by setting the thickness of the resin mask 20 to be about 3 μm or more and less than about 10 μm, still preferably about 4 μm or more and about 8 μm or less, the influence of a shadow in formation of a high definition pattern exceeding 400 ppi can be more effectively prevented. Moreover, while the resin mask 20 may be directly bonded to the metal mask 10 mentioned later or may be bonded thereto via an adhesive layer, in the case where the resin mask 20 is bonded to the metal mask 10 via the adhesive layer, the total thickness of the resin mask 20 and the adhesive layer is preferably within the aforementioned preferable thickness range. Notably, the shadow is a phenomenon that a part of a vapor deposition material released from a vapor deposition source collides with inner wall surfaces of the slit of the metal mask and/or the opening of the resin mask and does not reach the vapor deposition target, and thereby, a portion without vapor deposition that has a film thickness smaller than the intended vapor deposition film thickness arises.

(Second Device)

As shown in FIG. 8(b), the second device is a device to form the color material layer 40 on the region not formed with openings, in the resin mask 20, that is not in contact with the metal mask 10, and thereby, to set the resin mask 20 to have about 40% or less of light ray transmittance at a wavelength of about 550 nm. Notably, the color material layer 40 stated here is supposed to be included in the resin mask 20. In other words, a stacked body of the resin mask 20 and the color material layer 40 only has to have about 40% or less of light ray transmittance at a wavelength of about 550 nm.

For the material of the color material layer, the aforementioned color material components described for the first device only have to be properly selected to form a layer containing the color material component. The thickness of the color material layer 40 is not specially limited but the total thickness of the resin mask 20 and the color material layer 40 is preferably the aforementioned thickness of the resin mask 20 described for the first device.

(Third Device)

As shown in FIG. 8(c), the third device is a device to increase the thickness of the resin mask, and thereby, to set the light ray transmittance at a wavelength of about 550 nm to be about 40% or less.

With the third device, the thickness of the resin mask 20 that can have about 40% or less of light ray transmittance at a wavelength of about 550 nm can be properly configured depending on the material and the like of the resin mask, and is typically about 30 μm or more.

As described above, for the purpose of suppressing generation of a shadow, the thickness of the resin mask is preferably less than about 10 μm. Accordingly, in an embodiment of the present invention, it is preferable to set the resin mask 20 to have about 40% or less of light ray transmittance at a wavelength of about 550 nm using the aforementioned first device or the aforementioned second device. Notably, the resin mask 20 in the second device includes a problem that the color material layer 40 is peeled off from the resin mask 20, and/or a problem that peeled-off pieces arise in a cleaning step of cleaning the vapor deposition mask 100 or in a stage of forming the openings 25 in order to obtain the resin mask 20 in the second device. The resin mask in the first device obtained by causing the resin mask 20 to contain the color material component does not include these problems, and as compared with the resin mask 20 in the second device, it can be said to be a preferable device. Moreover, in view of the resin mask in the third device including a problem of long time in forming the openings 25 due to the large thickness of the resin mask 20, a problem that a shadow tends to be generated due to the large energy in the occasion when the openings 25 are formed by laser processing or the like, and the similar problem, the resin masks in the first device and the second device are preferable.

Moreover, while when the openings 25 are formed in the resin mask using laser processing or the like, the material of the resin mask is sometimes present as foreign matters in the openings 25 or near the openings 25, in the resin mask 20 in the first device, the resin mask 20 itself has a function of suppressing visible light from being transmitted, in other words, the foreign matters themselves caused by the material of the resin mask have a function of suppressing visible light from being transmitted. Accordingly, according to the resin mask 20 in the first device, not only the edge part of the opening 25 but also the foreign matter caused by the material of the resin mask can be correctly grasped with its shade. Furthermore, according to the resin mask 20 in the first device which is caused to contain the color material component, adjustment of the transmittance is easy, and the resin mask 20 can be simply set to have about 40% or less of light ray transmittance at a wavelength of about 550 nm.

Moreover, in the resin mask 20 of the vapor deposition mask 100 of an embodiment, the first device to the third device described above can be combined. Moreover, also by combining various devices other than these, the resin mask 20 can be set to have about 40% or less of light ray transmittance at a wavelength of about 550 nm.

As shown in FIGS. 8(a) to 8(c), according to the resin mask 20 having about 40% or less of light ray transmittance at a wavelength of about 550 nm, visible light cannot be transmitted or transmitted light transmitted through the region not formed with openings in the resin mask can be suppressed. FIG. 8(d) is a schematic cross-sectional view, of a conventional vapor deposition mask, schematically showing the state of transmitted light being transmitted through the openings 25 and the region not formed with openings in the occasion when the vapor deposition mask is irradiated with visible light. As comparison, also in FIGS. 8(a) to 8(c), the states of transmitted light being transmitted through the openings 25 and the region not formed with openings are schematically shown.

In order to confirm predominance of the resin mask set to have about 40% or less of light ray transmittance at a wavelength of about 550 nm, Samples 1 to 10 of the resin mask shown in Table 1 below were prepared to confirm the tone of shade. FIG. 12 shows shade images. Notably, FIG. 12(a) corresponds to Sample 1, FIG. 12(b) to Sample 2, FIG. 12(c) to Sample 4, FIG. 12(d) to Sample 5, and FIG. 12(e) to Sample 6. Sample 8 resulted in the contrast equivalent to that of the shade image shown in FIG. 12(c). Samples 3, 7, 9 and 10 resulted in slightly less contrasts than that of the shade image shown in FIG. 12(c). Measurements of light ray transmittances at about 550 nm, about 450 to 650 nm and about 380 to 780 nm of wavelengths were performed using a spectrometer (MPC-3100, Shimadzu Corporation). As a shade imaging apparatus, an appearance defect inspection apparatus (image processing apparatus: MP72000, Takano Co. Ltd.) was used, to observe transmitted light with a white light source. Moreover, the shape of the opening in plan view was set to be 50 μm squared (50 μm×50 μm). Evaluation results in the table were derived based on the following criteria. Moreover, for Samples 9 and 10, red iron oxide was used as the color material component in place of carbon black, and adjustment was performed such that the transmittance at each wavelength was the transmittance shown in Table 1 below.

(Evaluation Criteria of Samples)

1 . . . Openings cannot be recognized with shade.

2 . . . Contrast in tone of shade of the openings is low and defect inspection of the openings cannot be sufficiently performed.

3 . . . While the contrast in tone of shade of the openings appears to such an extent that defect inspection of the openings can be performed, there is a slight possibility of missing defects of the openings.

4 . . . Contrast in tone of shade of the openings is high and there is almost no possibility of missing defects of the openings.

5 . . . Contrast in tone of shade of the openings is extremely high and defect inspection precision of the openings is extremely high.

TABLE 1

| | Thickness of Resin Mask | Blending Amount | Transmittance (%) | | | Evaluation |
|---|---|---|---|---|---|---|
| | (μm) | of Carbon Black (*1) | 550 nm | 450-650 nm (*2) | 380-780 nm (*3) | Result |
| Sample 1 | 7 | 0 | 89 | 90 | 92 | 1 |
| Sample 2 | 8 | 0.5 | 61 | 65 | 70 | 2 |
| Sample 3 | 8 | 1 | 40 | 46 | 50 | 3 |
| Sample 4 | 7 | 2 | 30 | 37 | 40 | 4 |
| Sample 5 | 6 | 4 | 4 | 7 | 9 | 5 |
| Sample 6 | 4 | 6 | 2 | 4 | 5 | 5 |
| Sample 7 | 50 | 0 | 25 | 46 | 53 | 3 |
| Sample 8 | 8 | 1.3 | 35 | 39 | 45 | 4 |
| Sample 9 | 7 | Red Iron Oxide | 30 | 57 | 60 | 3 |
| Sample 10 | 6 | Red Iron Oxide | 40 | 68 | 70 | 3 |

(*1) . . . Pts. Mass of Carbon Black to 100 Pts. Mass of Polyimide Resin
(*2) . . . Maximum Value at 450 to 650 nm
(*3) . . . Maximum Value at 380 to 780 nm While in the mode shown in the figure, the opening shape of the opening 25 exhibits a rectangular shape, the opening shape is not specially limited but the opening shape of the opening 25 may be rhombic or polygonal or may be a shape having a curvature such as a circle and an ellipsoid. Notably, it can be said that the rectangular or polygonal opening shape is a preferable opening shape of the opening 25 in view of capability of securing a larger area of light emission as compared with the opening shape having a curvature such as a circle and an ellipsoid.

The sectional shape of the opening 25 is not specially limited and end surfaces that face each other and are of the resin mask forming the opening 25 may be substantially parallel to each other, but as shown in FIG. 1(b), the sectional shape of the opening 25 is preferably the shape having broadening toward a vapor deposition source. In other words, it preferably has a taper surface having broadening toward the metal mask 10 side. While a taper angle can be properly set with the thickness or the like of the resin mask taken into consideration, an angle formed by a straight line connecting a lower bottom distal end in the opening of the resin mask and an upper bottom distal end of the opening of the same resin mask and the bottom surface of the resin mask, in other words, an angle formed by an inner wall surface of the opening 25 and a surface of the resin mask 20 on the side that is not in contact with the metal mask 10 (a lower surface of the resin mask in the mode shown in the figure) in the cross section in the thickness direction of the inner wall surface constituting the opening 25 of the resin mask 20 is preferably within a range of about 5° to about 85°, still preferably within a range of about 15° to about 75°, further preferably within a range of about 25° to about 65°. In particular, within this range, it is preferably an angle smaller than a vapor deposition angle of a vapor deposition machine to be used. Moreover, in the mode shown in the figure, while an end surface that forms the opening 25 exhibits a linear shape, it is not limited thereto but may be in a curved shape convex outward, in other words, a shape of the entirety of the opening 25 may be a bowl shape.

(Metal Mask)

As shown in FIG. 1(b), the metal mask 10 is stacked on one surface of the resin mask 20. The metal mask 10 is constituted of metal, in which the slits 15 extending in the lengthwise direction or the crosswise direction are arranged. The slit 15 is synonymous with an opening. An arrangement example of the slits is not specially limited. The slits extending in the lengthwise direction and the crosswise direction may be arranged in a plurality of rows in the lengthwise direction and the crosswise direction. The slits extending in the lengthwise direction may be arranged in a plurality of rows in the crosswise direction. The slits extending in the crosswise direction may be arranged in a plurality of rows in the lengthwise direction. Moreover, they may be arranged in only one row in the lengthwise direction or the crosswise direction. Notably, "lengthwise direction" and "crosswise direction" stated in the present specification indicate the vertical direction and the horizontal direction in the drawings, respectively, and may be any directions of the longitudinal direction and the width direction. For example, the longitudinal direction of the vapor deposition mask, the resin mask and the metal mask may be set to be the "lengthwise direction", or the width direction thereof may be set to be the "lengthwise direction". Moreover, while in the present specification, the case where the shape of the vapor deposition mask in plan view is a rectangular shape is exemplarily described, it may be another shape such, for example, as a circular shape and a rhombic shape. In this case, the longitudinal direction of the diagonal line, the radial direction, or any direction only has to be set as the "longitudinal direction", the direction perpendicular to the "longitudinal direction" set as the "width direction (sometimes referred to as short-side direction)".

The material of the metal mask 10 is not specially limited but a conventionally known one in the field of the vapor deposition mask can be properly selected and used, and, for example, a metal material such as stainless steel, an iron-nickel alloy and an aluminum alloy can be cited. Above all, an invar material which is an iron-nickel alloy can be preferably used since an invar material is hardly deformed by heat.

Moreover, when vapor deposition is performed on the vapor-deposited surface of the vapor deposition target using the vapor deposition mask 100 of an embodiment, in the case where a magnet or the like is needed to be disposed behind the vapor deposition target to cause the vapor deposition mask 100 in front of the vapor deposition target to be attracted with magnetic force, it is preferable to form the metal mask 10 of a magnetic body. As the metal mask 10 of the magnetic body, iron nickel alloy, pure iron, carbon steel, tungsten (W) steel, chromium (Cr) steel, cobalt (Co) steel, KS steel which is alloy of iron containing cobalt, tungsten, chromium and carbon, MK steel having main components of iron, nickel and aluminum, NKS steel obtained by adding cobalt and titanium to MK steel, Cu—Ni—Co steel, aluminum (Al)-iron (Fe) alloy, and the like can be cited. Moreover, when the material itself forming the metal mask 10 is not a magnetic body, magnetism may be given to the metal mask 10 by dispersing powder of the aforementioned magnetic body in the relevant material.

While the thickness of the metal mask 10 is not specially limited, in order to more effectively prevent generation of a shadow, it is preferably about 100 μm or less, still preferably about 50 μm or less, particularly preferably about 35 μm or less. Notably, in the case of being thinner than about 5 μm, risks of rupture and deformation tend to increase and handling tends to become difficult.

Moreover, while in the mode shown in FIG. 1(a), the shape of the opening of the slit 15 in plan view exhibits a rectangular shape, the opening shape is not specially limited but the opening shape of the slit 15 may be any shape such as a trapezoid and a circle. The same holds true for the shape of the opening 25 of the resin mask 20.

The sectional shape of the slit 15 formed in the metal mask 10 is not specially limited but is preferably a shape having broadening toward the vapor deposition source as shown in FIG. 1(b). More specifically, an angle formed by a straight line connecting the lower bottom distal end in the slit 15 of the metal mask 10 with the upper bottom distal end in the same slit 15 of the same metal mask 10 and the bottom surface of the metal mask 10, in other words, an angle formed by the inner wall surface of the slit 15 and the surface of the metal mask 10 on the side of being in contact with the resin mask 20 (the lower surface of the metal mask in the shown mode) in the cross section in the thickness direction of the inner wall surface constituting the slit 15 of the metal mask 10 is preferably within a range of about 5° to about 85°, still preferably within a range of about 15° to about 80°, further preferably within a range of about 25° to about 65°. In particular, within this range, it is preferably an angle smaller than a vapor deposition angle of a vapor deposition machine to be used.

A method of stacking the metal mask 10 on the resin mask is not specially limited but the metal mask 10 may be pasted on the resin mask 20 using various adhesive agents or the resin mask that has self-adhesion may be used. The dimensions of the resin mask 20 and the metal mask 10 may be the same or may be different dimensions. Notably, with fixing to a frame which is arbitrarily performed afterward taken into consideration, the dimension of the resin mask 20 is preferably made smaller than that of the metal mask 10 to set the outer circumferential portion of the metal mask 10 to be in the state of exposure, which facilitates welding of the metal mask 10 to the frame.

Hereafter, preferable modes of the vapor deposition mask are described, exemplified by Embodiment (A) and Embodiment (B). Notably, the vapor deposition mask 100 of an embodiment of the present invention is not limited to the modes described below but may be in any mode as long as a condition is satisfied that the metal mask 10 in which the slit 15 is formed is stacked on the resin mask 20 in which the openings corresponding to a pattern to be produced by vapor deposition are formed at a position overlapping with the slit 15. For example, the slit 15 formed in the metal mask 10 may be stripe-shaped (not shown). Moreover, the slit 15 of the metal mask 10 may be provided at a position not overlapping with the whole one screen. In any mode, by setting the resin mask 20 to have about 40% or less of light ray transmittance at a wavelength of about 550 nm, when it is inspected whether or not the openings 25 of the resin mask 20 meet the vapor deposition pattern the formation of which is desired on the vapor-deposited surface of the vapor deposition target, the contrast in tone of shade can be enhanced and the edge part of the opening pattern of the openings 25 can be correctly grasped.

<Vapor Deposition Mask of Embodiment (A)>

Figure 2:
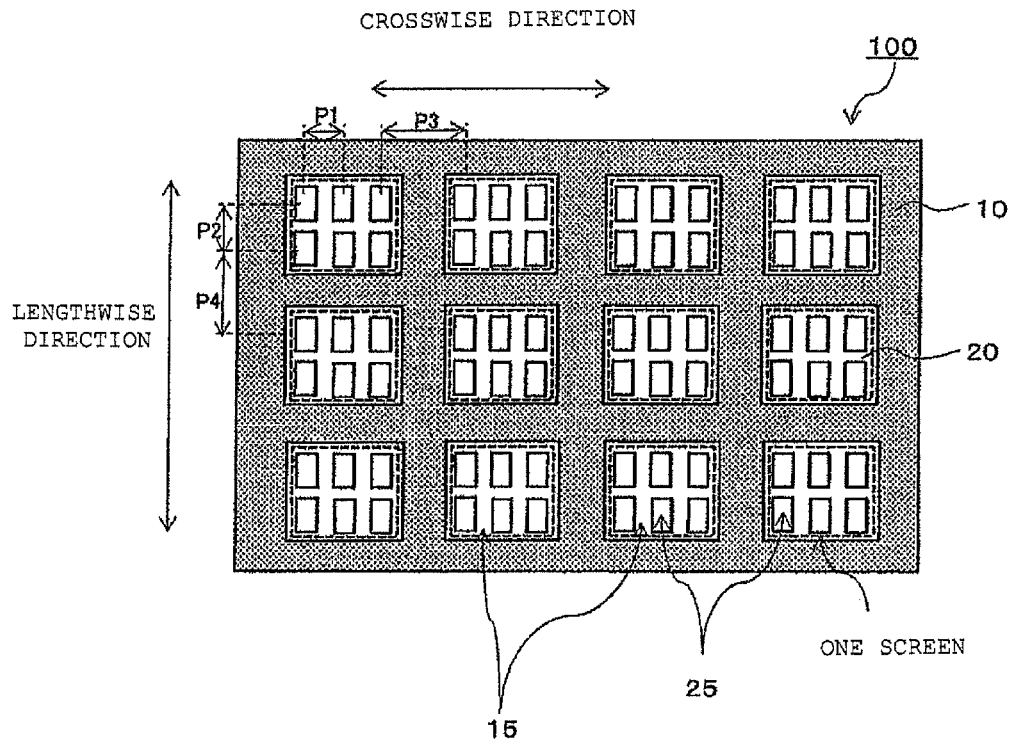
FIG. 2 is an elevation view of the vapor deposition mask of Embodiment (A) as seen from the metal mask side.
Figure 3:
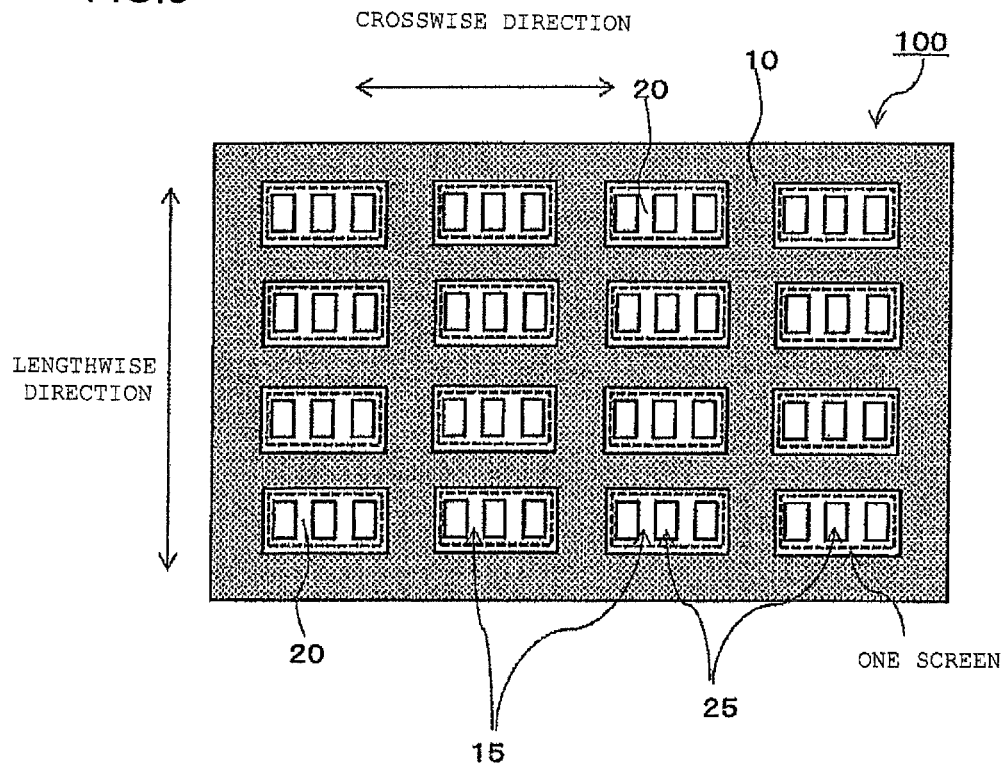
FIG. 3 is an elevation view of the vapor deposition mask of Embodiment (A) as seen from the metal mask side.

As shown in FIG. 2, the vapor deposition mask 100 of Embodiment (A) is a vapor deposition mask for simultaneously forming vapor deposition patterns for a plurality of screens and includes the metal mask 10 in which the plurality of slits 15 are provided and the resin mask 20, the metal mask being stacked on one surface of the resin mask, wherein the openings needed for constituting the plurality of screens are provided in the resin mask 20, and each slit 15 is provided at a position overlapping with the entirety of at least one screen. Also in the vapor deposition mask 100 of Embodiment (A), the resin mask 20 is set to have about 40% or less of light ray transmittance at a wavelength of about 550 nm.

The vapor deposition mask 100 of Embodiment (A) is a vapor deposition mask used for simultaneously forming vapor deposition patterns for a plurality of screens. One vapor deposition mask 100 can simultaneously form vapor deposition patterns compatible with a plurality of products. "Openings" stated for the vapor deposition mask of Embodiment (A) mean patterns to be produced using the vapor deposition masks 100 of Embodiment (A). For example, when the vapor deposition mask is used for forming an organic layer in an organic EL display, the shape of the openings 25 is a shape of the organic layer. Moreover, "one screen" is constituted of an aggregate of openings 25 corresponding to one product. When the one product is an organic EL display, an aggregate of organic layers needed for forming one organic EL display, in other words, an aggregate of openings 25 to be the organic layers is "one screen". Further, in the vapor deposition mask 100 of Embodiment (A), in order to simultaneously form the vapor deposition patterns for the plurality of screens, the aforementioned "one screen" is arranged for each of the plurality of screens in the resin mask 20 at predetermined intervals. Namely, in the resin mask 20, the openings 25 needed for constituting the plurality of screens are provided.

The vapor deposition mask of Embodiment (A) includes the metal mask 10 in which the plurality of slits 15 are provided, the metal mask being provided on one surface of the resin mask, wherein each slit is provided at the position overlapping with the entirety of at least one screen. In other words, it is characterized in that between the openings 25 needed for constituting one screen, metal line portions which have the same length as the length of the slit 15 in the lengthwise direction and have the same thickness as that of the metal mask 10 between the openings 25 adjacent in the crosswise direction, or metal line portions which have the same length as the length of the slit 15 in the crosswise direction and have the same thickness as that of the metal mask 10 between the openings 25 adjacent in the lengthwise direction do not exist. Hereafter, the metal line portions which have the same length as the length of the slit 15 in the lengthwise direction and have the same thickness as that of the metal mask 10 and the metal line portions which have the same length as the length of the slit 15 in the crosswise direction and have the same thickness as that of the metal mask 10 are sometimes collectively referred to simply as metal line portions.

According to the vapor deposition mask 100 of Embodiment (A), even when the dimension of the openings 25 needed for constituting one screen and the pitch between the openings 25 constituting one screen are made small, for example, even when the dimension of the openings 25 and the pitch between the openings 25 are made extremely fine in order to form a screen exceeding 400 ppi, interference due to metal line portions can be prevented and an image with high definition can be formed. Notably, when one screen is divided by a plurality of slits, in other words, when the metal line portions having the same thickness as that of the metal mask 10 exist between the openings 25 constituting one screen, as the pitch between the openings 25 constituting one screen is smaller, the metal line portions existing between the openings 25 more become a hindrance in forming the vapor deposition pattern on the vapor deposition target and the vapor deposition pattern with high definition is more difficult to be formed. In other words, when the metal line portions having the same thickness as that of the metal mask 10 exist between the openings 25 constituting one screen, the metal line portions in the case of setting the frame-equipped vapor deposition mask cause generation of a shadow, which results in difficulty of formation of a screen with high definition.

Next, referring to FIG. 2 to FIG. 6, the openings 25 constituting one screen are exemplarily described. Notably, a region enclosed by a broken line in the modes shown in the figures is one screen. While in the modes shown in the figures, an aggregate of a small number of openings 25 is one screen for convenience of description, not limited to these modes, for example, the openings 25 for millions of pixels may be present in one screen, where one opening 25 is one pixel.

In the mode shown in FIG. 2, one screen is constituted of an aggregate of openings 25 having a plurality of openings 25 provided in the lengthwise direction and the crosswise direction. In the mode shown in FIG. 3, one screen is constituted of an aggregate of openings 25 having a plurality of openings 25 provided in the crosswise direction. Moreover, in the mode shown in FIG. 4, one screen is constituted of an aggregate of openings 25 having a plurality of openings 25 in the lengthwise direction. Further, in FIG. 2 to FIG. 4, the slit 15 is provided at a position overlapping with the entirety of one screen.

Figure 5A:
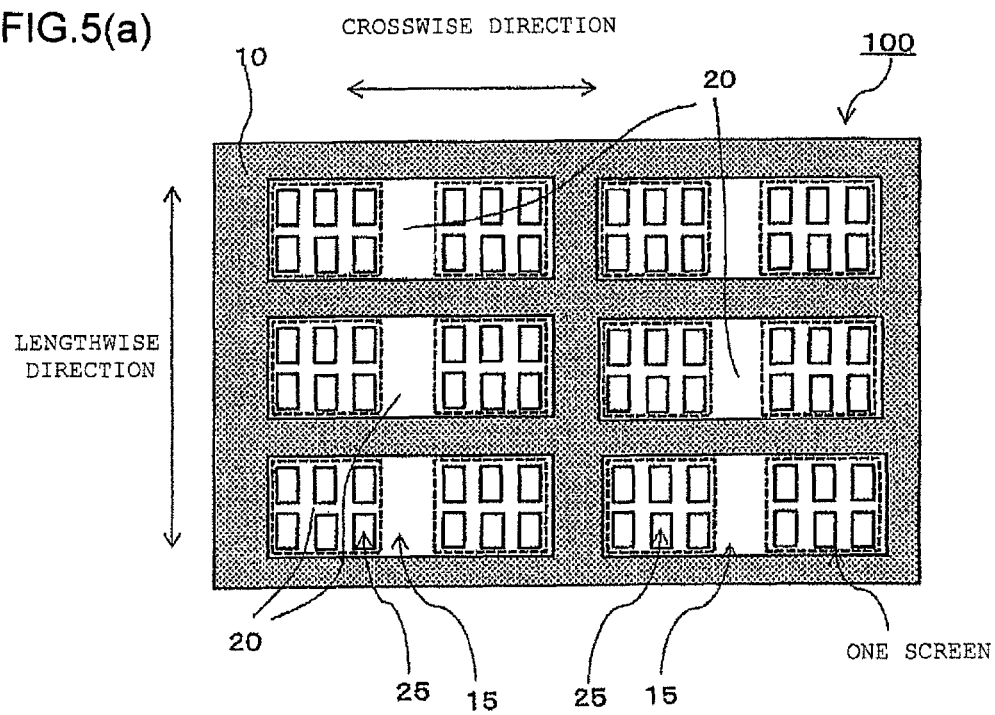
FIG. 5 presents elevation views of the vapor deposition mask of Embodiment (A) as seen from the metal mask side.
Figure 5B:
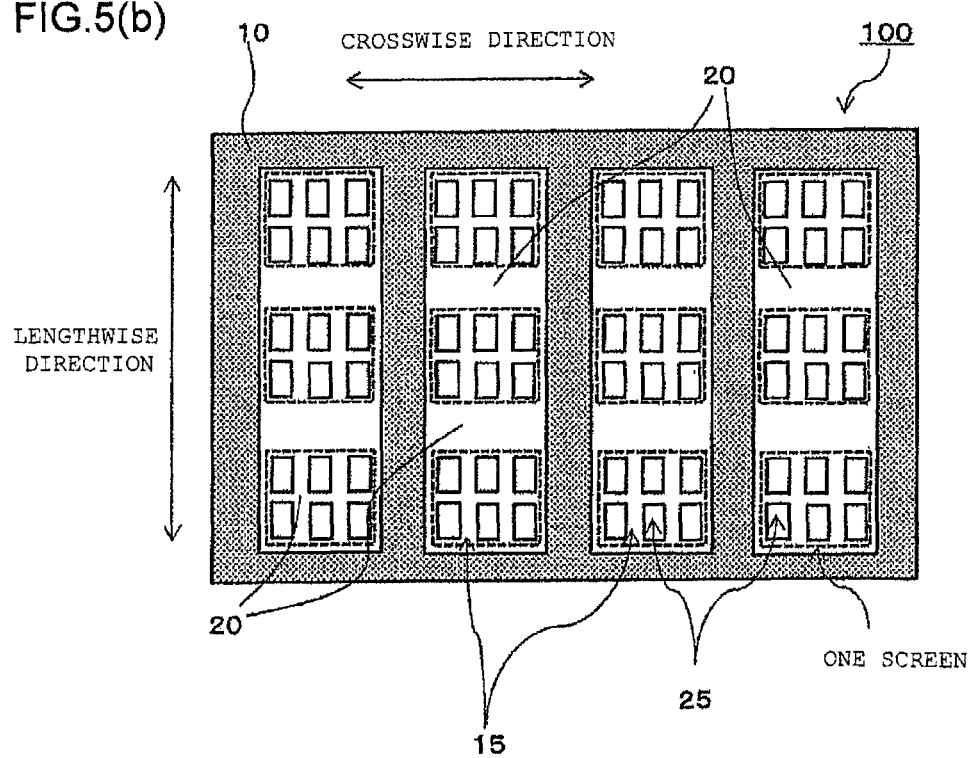

As described above, the slit 15 may be provided at a position overlapping with only one screen, or as shown in FIGS. 5(a) and 5(b), may be provided at a position overlapping with the entirety of two or more screens. In FIG. 5(a), in the resin mask 10 shown in FIG. 2, the slit 15 is provided at a position overlapping with the entirety of two screens continuous in the crosswise direction. In FIG. 5(b), the slit 15 is provided at a position overlapping with the entirety of three screens continuous in the lengthwise direction.

Next, exemplified by the mode shown in FIG. 2, pitches between the openings 25 constituting one screen and pitches between the screens are described. The pitches between the openings 25 constituting one screen and the dimension of the opening 25 are not specially limited but can be properly set depending on the pattern to be produced by vapor deposition. For example, when forming the vapor deposition pattern with high definition of 400 ppi, a pitch (P1) in the crosswise direction and a pitch (P2) in the lengthwise direction between the neighboring openings 25 out of the openings 25 constituting one screen are about 60 μm. Moreover, the dimension of the opening is about 500 μm² to about 1000 μm². Moreover, one opening 25 is not limited to correspond to one pixel but, for example, a plurality of pixels can also be collectively one opening 25 depending on a pixel arrangement.

While a pitch (P3) in the crosswise direction and a pitch (P4) in the lengthwise direction between the screens are not specially limited but, as shown in FIG. 2, when one slit 15 is provided at the position overlapping with the entirety of one screen, metal line portions are to exist between the screens. Accordingly, when the pitch (P3) in the crosswise direction and the pitch (P4) in the lengthwise direction between the screens are smaller than or substantially equal to the pitch (P1) in the crosswise direction and the pitch (P2) in the lengthwise direction of the openings 25 provided in one screen, the metal line portions existing between the screens are liable to break. Accordingly, with this point taken into consideration, the pitch (P3, P4) between the screens is preferably wider than the pitch (P1, P2) between the openings 25 constituting one screen. The pitch (P3, P4) between the screens is exemplarily about 1 mm to about 100 mm. Notably, the pitch between the screens means the pitch between the neighboring openings in one screen and another screen adjacent to the one screen. The same holds true for the pitch between the openings 25 and the pitch between the screens in the vapor deposition mask of Embodiment (B) mentioned later.

Notably, as shown in FIG. 5, when one slit 15 is provided at the position overlapping with the entirety of two or more screens, metal line portions constituting the inner wall surfaces of the slit are not to exist between the plurality of screens provided in the one slit 15. Accordingly, in this case, the pitch between the two or more screens provided at the position overlapping with the one slit 15 may be substantially equal to the pitch between the openings 25 constituting one screen.

<Vapor Deposition Mask of Embodiment (B)>

Figure 6:
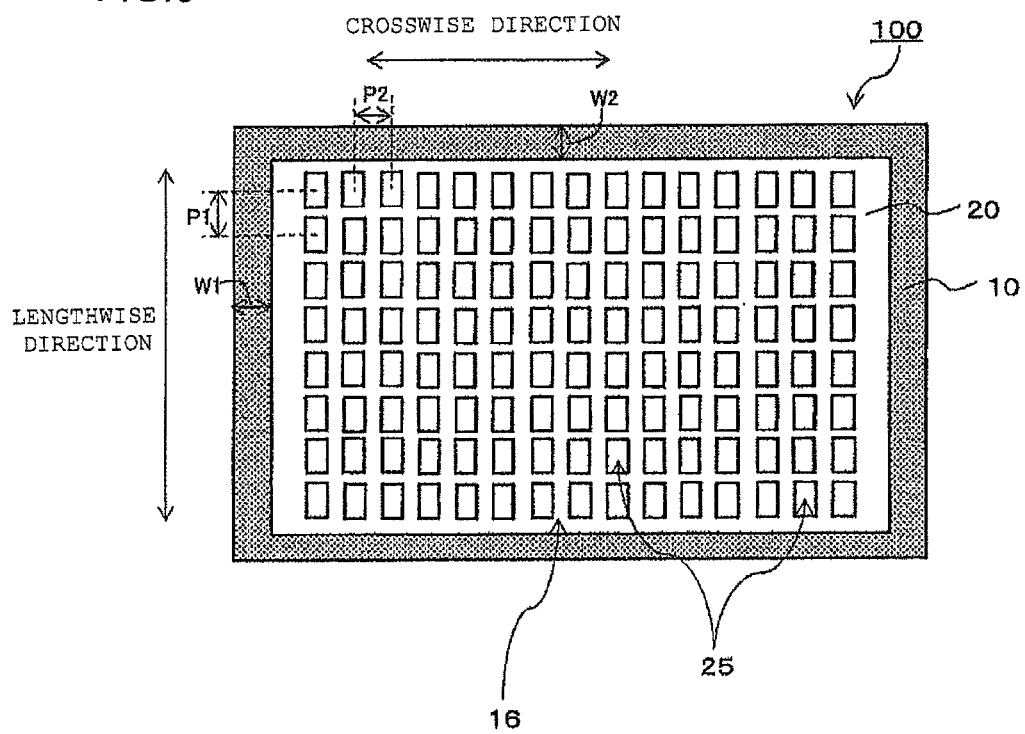
FIG. 6 is an elevation view of the vapor deposition mask of Embodiment (B) as seen from the metal mask side.

Next, the vapor deposition mask of Embodiment (B) is described. As shown in FIG. 6, the vapor deposition mask of Embodiment (B) includes the metal mask 10 in which one slit (one through hole 16) is provided and the resin mask 20 in which the plurality of openings 25 corresponding to a pattern to be produced by vapor deposition are provided, the metal mask being stacked on one surface of resin mask, wherein all of the plurality of openings 25 are provided at a position overlapping with the one through hole provided in the metal mask 10.

The opening 25 stated for Embodiment (B) means an opening needed for forming the vapor deposition pattern on the vapor deposition target. An opening not needed for forming the vapor deposition pattern on the vapor deposition target may be provided at a position of not overlapping with the one through hole 16. Notably, FIG. 6 is an elevation view which exemplarily shows the vapor deposition mask of Embodiment (B) and is of the vapor deposition mask as seen from the metal mask side.

In the vapor deposition mask 100 of Embodiment (B), the metal mask 10 having the one through hole 16 is provided on the resin mask 20 having the plurality of openings 25, and all of the plurality of openings 25 are provided at a position overlapping with the one through hole 16. In the vapor deposition mask 100 of Embodiment (B) that has this configuration, metal line portions that have the same thickness as the thickness of the metal mask or a larger thickness than the thickness of the metal mask do not exist between the openings 25. Hence, as described for the aforementioned vapor deposition mask of Embodiment (A), the vapor deposition pattern with high definition can be formed to match the dimensions of the openings 25 provided in the resin mask 20 without suffering interference of metal line portions.

Moreover, according to the vapor deposition mask of Embodiment (B), there is almost no influence of a shadow even when the thickness of the metal mask 10 is made large. Hence, the thickness of the metal mask 10 can be made larger to such an extent that durability and handling ability are sufficiently satisfied. While a vapor deposition pattern with high definition can be formed, durability and handling ability can be improved.

The resin mask 20 in the vapor deposition mask of Embodiment (B) is constituted of resin, in which as shown in FIG. 6, the plurality of openings 25 corresponding to a pattern to be produced by vapor deposition are provided at a position overlapping with the one through hole 16. The openings 25 correspond to the pattern to be produced by vapor deposition. By a vapor deposition material released from a vapor deposition source passing through the openings 25, the vapor deposition pattern corresponding to the openings 25 is formed on the vapor deposition target. Notably, while in the mode shown in the figure, the openings arranged in a plurality of rows in the lengthwise direction and the crosswise direction are exemplarily described, they may be arranged only in the lengthwise direction or in the crosswise direction. Also in the vapor deposition mask 100 of Embodiment (B), the resin mask 20 is set to have about 40% or less of light ray transmittance at a wavelength of about 550 nm.

"One screen" in the vapor deposition mask 100 of Embodiment (B) means an aggregate of openings 25 corresponding to one product. When the one product is an organic EL display, an aggregate of organic layers needed for forming one organic EL display, in other words, an aggregate of openings 25 to be the organic layers is "one screen". While the vapor deposition mask of Embodiment (B) may be constituted of only "one screen" or may be provided by arranging the "one screen" for each of a plurality of screens, in the case where the "one screen" is arranged for each of the plurality of screens, the openings 25 are preferably provided at predetermined intervals on a screen-by-screen basis (refer to FIG. 5 for the vapor deposition mask of Embodiment (A)). The mode of "one screen" is not specially limited but, for example, the one screen can also be constituted of millions of openings 25, where one opening 25 is one pixel.

(Metal Mask)

The metal mask 10 in the vapor deposition mask 100 of Embodiment (B) is constituted of metal and includes the one through hole 16. Further, in an embodiment of the present invention, the one through hole 16 is disposed at a position overlapping with all of the openings 25 as seen head-on of the metal mask 10, in other words, at a position where all of the openings 25 arranged in the resin mask 20 can be seen.

Figure 7:
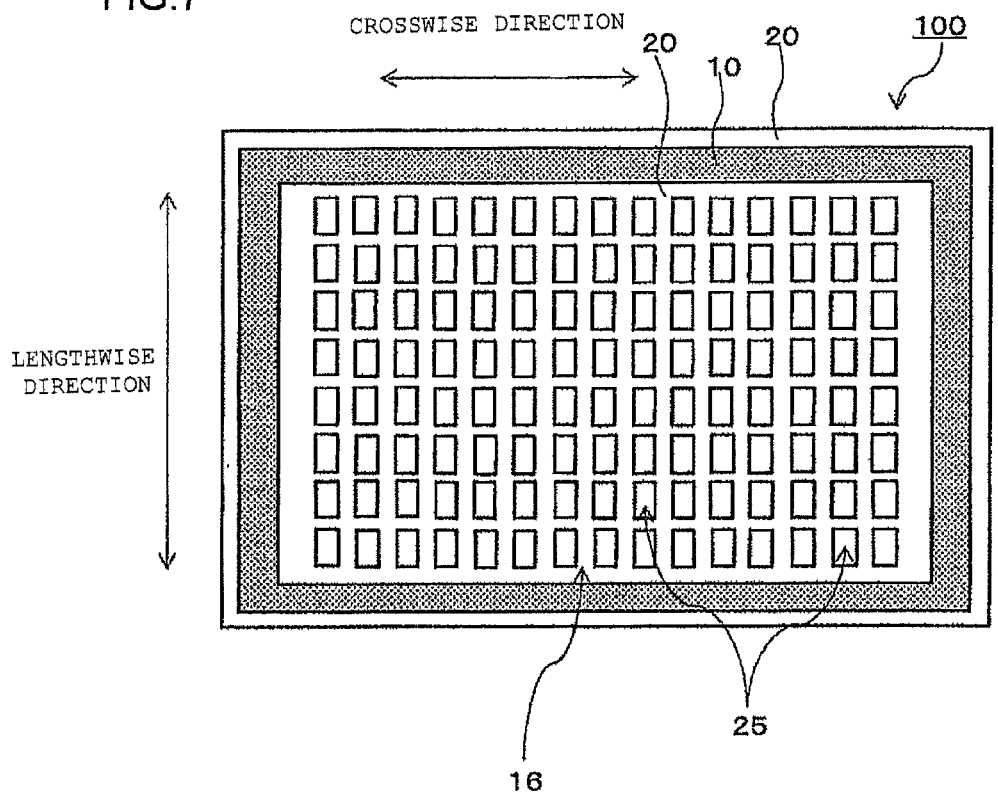
FIG. 7 is an elevation view of the vapor deposition mask of Embodiment (B) as seen from the metal mask side.

The metal portion constituting the metal mask 10, that is, the portion thereof other than the one through hole 16 may be provided along the outer edge of the vapor deposition mask 100 as shown in FIG. 6, or the dimension of the metal mask 10 may be made smaller than that of the resin mask 20 to expose an outer circumferential portion of the resin mask 20 as shown in FIG. 7. Moreover, the dimension of the metal mask 10 may be made larger than that of the resin mask 20, so that a part of the metal portion is caused to protrude outward in the crosswise direction of the resin mask or outward in the lengthwise direction thereof. Notably, in any cases, the dimension of the one through hole 16 is configured to be smaller than the dimension of the resin mask 20.

While a width (W1), in the crosswise direction, and a width (W2), in the lengthwise direction, of the metal portion constituting the wall surface of the through hole 16 of the metal mask 10 shown in FIG. 6 are not specially limited, as the width W1, W2 is made smaller, durability and handling ability tend to deteriorate more. Accordingly, W1 and W2 are preferably widths by which durability and handling ability are sufficiently satisfied. While appropriate widths can be properly set depending on the thickness of the metal mask 10, as an example of preferable widths, both W1 and W2 are about 1 mm to about 100 mm, which are the same widths of the metal mask of Embodiment (A).

Moreover, while in the vapor deposition mask of each embodiment described above, the openings 25 are regularly formed in the resin mask 20, the openings 25 may be alternately arranged in the crosswise direction or the lengthwise direction as seen from the metal mask 10 side of the vapor deposition mask 100 (not shown). In other words, the openings 25 adjacent in the crosswise direction may be displaced and arranged in the lengthwise direction. In such an arrangement, even in the case of thermal expansion of the resin mask 20, the openings 25 can absorb expansions arising in portions therein, and a large deformation due to accumulation of the expansions can be prevented from arising.

Moreover, in the vapor deposition mask of each embodiment described above, on the resin mask 20, grooves (not shown) extending in the lengthwise direction or the crosswise direction of the resin mask 20 may be formed. While in the case of application of heat in vapor deposition, there is a possibility that the resin mask 20 undergoes thermal expansion, and thereby, changes in dimension and position of the opening arise, by forming the grooves, they can absorb the expansion of the resin mask, and can prevent the changes in dimension and position of the opening 25 caused by the resin mask 20 expanding in a predetermined direction as a whole due to accumulation of thermal expansions arising in portions in the resin mask. Formation positions of the grooves are not limited but while they may be provided between the openings 25 constituting one screen and at positions overlapping with the openings 25, they are preferably provided between the screens. Moreover, the grooves may be provided on one surface of the resin mask, for example, only on the surface on the side that is in contact with the metal mask, or may be provided only on the surface on the side that is not in contact with the metal mask. Otherwise, they may be provided on both surfaces of the resin mask 20.

Moreover, the grooves extending in the lengthwise direction may be between the neighboring screens, or the grooves extending in the crosswise direction may be formed between the neighboring screens. Furthermore, the grooves can also be formed in an aspect having these combined.

The depth and the width of the grooves are not specially limited but since the rigidity of the resin mask 20 tends to decrease in the case where the depth of the grooves is too large and in the case where the width thereof is too large, setting is needed with this point taken into consideration. Moreover, the sectional shape of the grooves is not specially limited but only has to be arbitrarily selected as a U-shape, a V-shape or the like with the processing method and the like taken into consideration. The same holds true for the vapor deposition mask of Embodiment (B).

<<Method for Producing Vapor Deposition Mask>>

Hereafter, the method for producing a vapor deposition mask of an embodiment is exemplarily described. The vapor deposition mask 100 of an embodiment can be obtained by preparing the resin plate-equipped metal mask in which the metal mask 10 provided with the slits 15 is stacked on one surface of the resin plate, and next, irradiating the resin plate-equipped metal mask with laser through the slits 15 from the metal mask 10 side to form the openings 25 corresponding to a pattern to be produced by vapor deposition in the resin plate.

As a method of forming the resin plate-equipped metal mask, the metal mask 10 provided with the slits 15 is stacked on one surface of the resin plate. The resin plate can employ the materials described for the aforementioned resin mask 20. Moreover, in the case of setting the aforementioned resin mask in the first device, the resin plate contains the color material component and the resin plate has about 40% or less of light ray transmittance at a wavelength of about 550 nm.

As the method for forming the metal mask 10 in which the slits 15 are provided, a masking member, for example, a resist material is applied onto the surface of the metal plate, predetermined portions thereof are exposed and developed, and thereby, a resist pattern in which positions where the slits 15 are finally to be formed remain is formed. The resist material used as the masking member is preferably excellent in processing ability with desired resolution. Next, etching processing is performed by an etching method using the resist pattern as an etching resistant mask. After the completion of the etching, the resist pattern is cleaned and removed. In this way, the metal mask 10 in which the slits 15 are provided is obtained. The etching for forming the slits 15 may be performed on one surface side of the metal plate or may be performed on both surfaces thereof. Moreover, in the case where the slits 15 are formed in the metal plate using the stacked body in which the resin plate is provided on the metal plate, the masking member is applied onto the surface of the metal plate on the side that is not in contact with the resin plate, and the slits 15 are formed by the etching from one surface side. Notably, in the case where the resin plate has etching resistance with respect to the etching agent for the metal plate, masking of the surface of the resin plate is not needed but, in the case where the resin plate does not have resistance with respect to the etching agent for the metal plate, the masking member is needed to be applied onto the surface of the resin plate. Moreover, in the above, while the resist material is mainly described as the masking member, in place of the application of the resist material, a dry film resist may be laminated to perform the similar patterning.

In the aforementioned method, the resin plate constituting the resin plate-equipped metal mask may be a resin layer or a resin film formed by coating as well as a plate-shaped resin. In other words, the resin plate may be beforehand prepared, or in the case of forming the resin plate-equipped metal mask using the metal plate and the resin plate, the resin layer or the resin film to be the resin mask in the final stage can also be formed on the metal plate by a conventionally known coating method or the like. For example, in the case of setting the aforementioned resin mask in the first device, resin plate coating liquid obtained by dispersing or dissolving the material of the resin mask and the color material component which are described above and arbitrary components added as needed in an appropriate solvent is prepared, the metal plate is coated with this using a conventionally known coating device to be dried, and thereby, the resin plate can be set for obtaining the aforementioned resin mask 20 in the first device.

As a method for forming the openings 25, the resin plate is penetrated using a laser processing method, fine press processing, photolithography processing or the like on the resin plate-equipped metal mask prepared above to form the openings 25 corresponding to a pattern to be produced by vapor deposition in the resin plate, and thereby, the vapor deposition mask 100 of an embodiment in which the metal mask 10 in which the slit 15 is provided is stacked on one surface of the resin mask 20 in which the openings 25 corresponding to the pattern to be produced by vapor deposition are provided is obtained. Notably, in view of capability of easily forming the openings 25 with high definition, the laser processing method is preferably used for the formation of the openings 25.

In the case of setting the aforementioned resin mask in the second device, before forming the openings 25, the color material layer 40 may be formed on the resin plate to form the openings 25 penetrating the color material layer 40 and the resin plate, or after forming the openings 25 penetrating the resin plate to obtain the resin mask 20, the color material layer 40 may be formed on the region not formed with openings in the resin mask 20.

Moreover, in the stage before forming the openings 25 in the resin plate, the resin plate-equipped metal mask may be fixed to a frame. By not fixing the completed vapor deposition mask to the frame but afterward providing the openings with respect to the resin plate-equipped metal mask in the state of being fixed to the frame, position precision can be exceedingly improved. Notably, when the completed vapor deposition mask 100 is fixed to the frame, since the metal mask in which the opening is determined is fixed while being stretched with respect to the frame, opening position coordination precision is to deteriorate. A method for fixing a frame 60 and the resin plate-equipped vapor deposition mask to each other is not specially limited but the fixation can be performed using spot welding of fixation with laser light or the like, an adhesive agent, screw fastening, or another method other than these.

<<Frame-Equipped Vapor Deposition Mask>>

Figure 9:
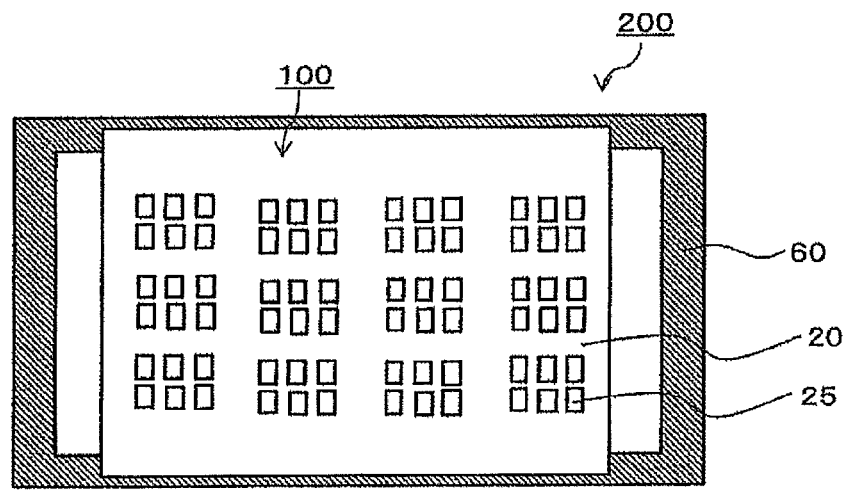
FIG. 9 is an elevation view exemplarily showing a frame-equipped vapor deposition mask.
Figure 10:
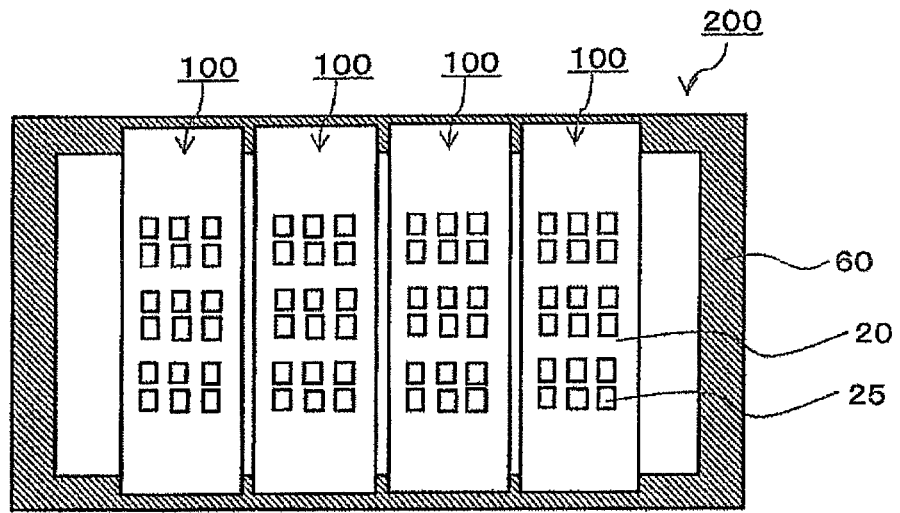
FIG. 10 is an elevation view exemplarily showing a frame-equipped vapor deposition mask.

Next, a frame-equipped vapor deposition mask of an embodiment of the present invention is described. As shown in FIGS. 9 and 10, the frame-equipped vapor deposition mask 200 of an embodiment of the present invention is constituted by fixing the vapor deposition mask 100 onto the frame 60, wherein the vapor deposition mask 100 includes the metal mask in which the slit 15 is formed and the resin mask 20 in which the openings 25 corresponding to a pattern to be produced by vapor deposition are formed at a position overlapping with the slit, the metal mask and the resin mask being stacked, and the resin mask 20 has about 40% or less of light ray transmittance at a wavelength of about 550 nm. According to the frame-equipped vapor deposition mask 200 having this feature, while satisfying both high definition and lightweight, confirmation of whether or not a shape pattern of openings formed in the resin mask 20 is normal or similar confirmation can be correctly performed even after fixing the vapor deposition mask 100 to the frame 60.

In the frame-equipped vapor deposition mask 200 of an embodiment of the present invention, as shown in FIG. 9, one vapor deposition mask 100 may be fixed to the frame 60, or as shown in FIG. 10, a plurality of vapor deposition masks 100 may be fixed to the frame 60.

(Vapor Deposition Mask)

For the vapor deposition mask 100 constituting the frame-equipped vapor deposition mask 200, the vapor deposition mask 100 of an embodiment of the present invention described above can be used as it is, and detailed description thereof is omitted here. Notably, the vapor deposition mask of an embodiment stated here is supposed to also include the vapor deposition masks in the preferable modes described above (vapor deposition masks of Embodiment (A) and Embodiment (B)).

(Frame)

The frame 60 is a substantially rectangular frame member and includes a through hole for exposing the openings 25 provided in the resin mask 20 of the vapor deposition mask 100 fixed in the final stage to the vapor deposition source side. The material of the frame is not specially limited but a metal material large in rigidity, for example, a SUS or invar material or a ceramic material or the like can be used. Above all, a metal frame is preferable in view of being able to easily perform welding to the metal mask of the vapor deposition mask and being small in influence of deformation and the like.

The thickness of the frame is not specially limited but is preferably about 10 mm to 30 mm in view of rigidity and the like. The widths of the inner circumferential end face of the opening of the frame and the outer circumferential end face of the frame are not specially limited as long as they are widths with which the frame and the metal mask of the vapor deposition mask can be fixed to each other, but, for example, widths of about 10 mm to 50 mm can be exemplarily cited.

Figure 11A:
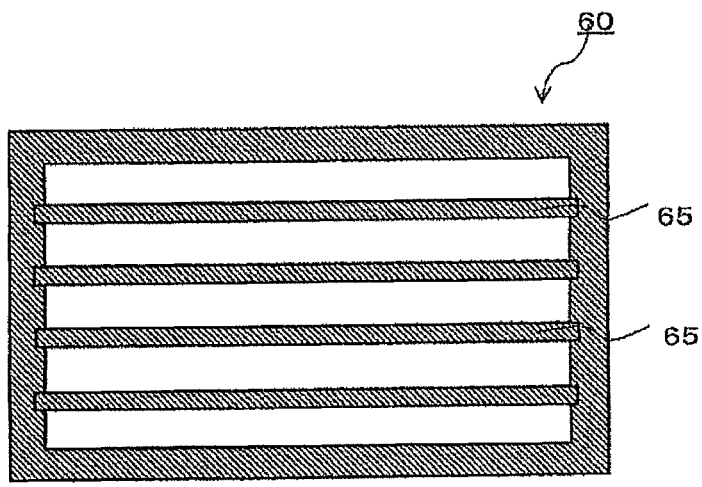
FIG. 11 is an elevation view exemplarily showing a frame.
Figure 11B:
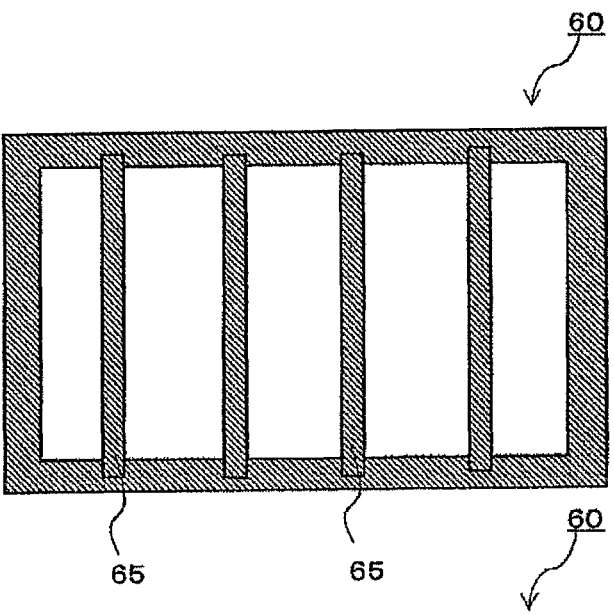
Figure 11C:
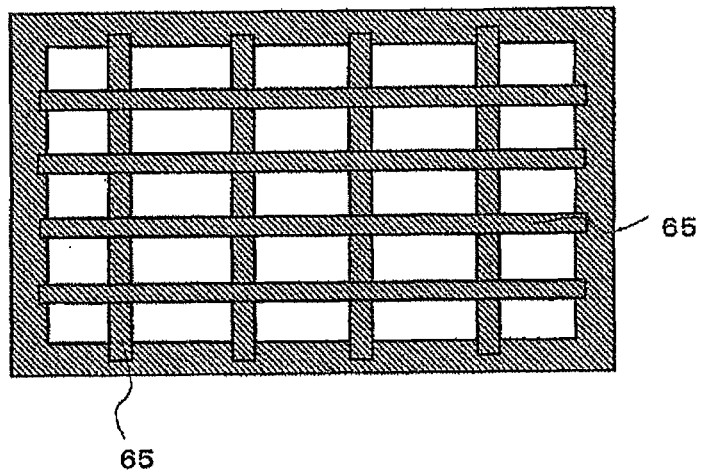
Figure 12A:
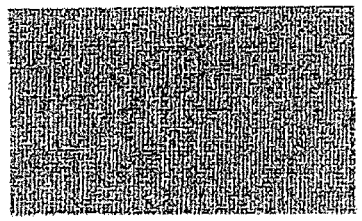
FIG. 12 Portions (a) to (e) are shade diagrams of Samples 1, 2 and 4 to 6 of the resin mask, respectively.
Figure 12B:
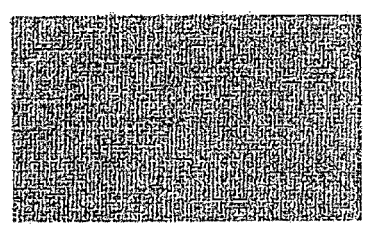
Figure 12C:
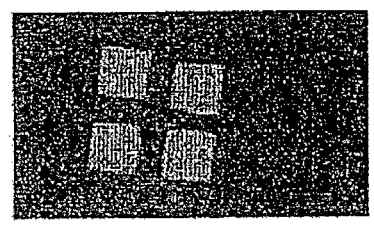
Figure 12D:
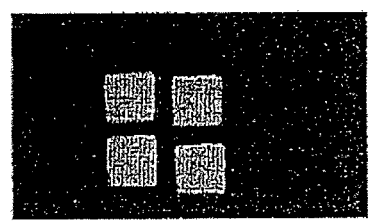
Figure 12E:
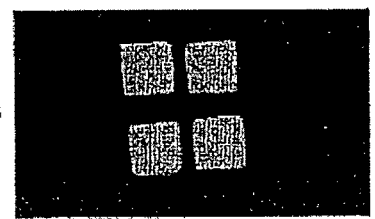

Moreover, as shown in FIGS. 11(a) to 11(c), the frame 60 in which reinforcement frames 65 and the like are provided in the region of the through hole may be used so as not to disturb exposure of the openings 25 of the resin mask 20 constituting the vapor deposition mask 100. In other words, a configuration in which the opening included in the frame 60 is divided by the reinforcement frames and the like may be included. To provide the reinforcement frames 65 enables the frame 60 and the vapor deposition mask 100 to be fixed to each other using the relevant reinforcement frames 65. Specifically, when a plurality of vapor deposition masks 100 described above are arranged and fixed in the lengthwise direction and the crosswise direction, the vapor deposition masks 100 can be fixed to the frame 60 also at positions where the reinforcement frames and the vapor deposition masks overlap with each other.

A method for fixing the frame 60 and the vapor deposition mask 100 to each other is not specially limited but the fixation can be performed using spot welding of fixation with laser light or the like, an adhesive agent, screw fastening, or another method other than these.

<<Vapor Deposition Mask Preparation Body>>

Next, a vapor deposition mask preparation body of an embodiment of the present invention is described. The vapor deposition mask preparation body of an embodiment of the present invention (not shown) is used for obtaining the vapor deposition mask including the metal mask 10 in which the slit 15 is formed and the resin mask 20 in which the openings 25 corresponding to a pattern to be produced by vapor deposition are formed at a position overlapping with the slit, the metal mask and the resin mask being stacked, wherein the metal mask in which the slit is provided is stacked on one surface of a resin plate, and the resin plate has about 40% or less of light ray transmittance at a wavelength of about 550 nm.

The vapor deposition mask preparation body of an embodiment of the present invention is common to the vapor deposition mask 100 of an embodiment described above except that the openings 25 are not provided in the resin plate, and specific description thereof is omitted. As a specific configuration of the vapor deposition mask preparation body of an embodiment, the resin plate-equipped metal mask described for the aforementioned method for producing a vapor deposition mask can be cited.

According to the aforementioned vapor deposition mask preparation body of an embodiment, by forming the openings in the resin plate of the vapor deposition mask preparation body, the vapor deposition mask can be obtained capable of correctly performing confirmation of whether or not a shape pattern of openings formed in the resin mask is normal or similar confirmation while satisfying both high definition and lightweight.

While in the above, as the vapor deposition mask preparation body, the resin plate-equipped metal mask is exemplarily described in which the metal mask in which the slit is provided is stacked on one surface of the resin plate having about 40% or less of light ray transmittance at a wavelength of about 550 nm, a resin plate-equipped metal plate in which a metal plate for forming the metal mask is stacked on one surface of the resin plate having about 40% or less of light ray transmittance at a wavelength of about 550 nm may be set to be the vapor deposition mask preparation body. With this vapor deposition mask preparation body, the slit is formed in the metal plate of the resin plate-equipped metal plate, next, the openings overlapping with the slit formed in the metal plate are formed in the resin plate, and thereby, the vapor deposition mask of an embodiment described above can be obtained.

(Method for Producing Organic Semiconductor Element)

Next, a method for producing an organic semiconductor element of an embodiment of the present invention is described. The method for producing an organic semiconductor element of an embodiment includes a step of forming a vapor deposition pattern on a vapor deposition target using a frame-equipped vapor deposition mask in which a vapor deposition mask is fixed to a frame, wherein in the step of forming the vapor deposition pattern, the vapor deposition mask fixed to the frame includes a metal mask in which a slit is formed and a resin mask in which an opening corresponding to a pattern to be produced by vapor deposition is formed at a position overlapping with the slit, the metal mask and the resin mask being stacked, and further, the resin mask has about 40% or less of light ray transmittance at a wavelength of about 550 nm.

The method for producing an organic semiconductor element of an embodiment including the step of forming a vapor deposition pattern in a vapor deposition method using the frame-equipped vapor deposition mask includes an electrode forming step, an organic layer forming step, a counter electrode forming step, a sealing layer forming step and the like in which electrodes are formed on a substrate, and in any of the steps, a vapor deposition pattern is formed on the substrate in a vapor deposition method using the frame-equipped vapor deposition mask. For example, in the case where the vapor deposition method using the frame-equipped vapor deposition mask is applied to each of light-emitting layer forming steps for colors of R, G and B in an organic EL device, vapor deposition patterns are formed for the light-emitting layers for the colors on the substrate. Notably, the method for producing an organic semiconductor element of an embodiment of the present invention is not limited to these steps but can be applied to any steps in conventionally known production of an organic semiconductor element using a vapor deposition method.

The method for producing an organic semiconductor element of an embodiment of the present invention is characterized in that the aforementioned frame-equipped vapor deposition mask which is used in the step of forming the vapor deposition pattern and in which the vapor deposition mask is fixed to the frame is the frame-equipped vapor deposition mask 200 of an embodiment of the present invention described above, and detailed description thereof is omitted here. According to the method for producing an organic semiconductor element using the frame-equipped vapor deposition mask, an organic semiconductor element having a pattern with high definition can be formed. As organic semiconductor elements produced in the method for producing an organic semiconductor element of an embodiment of the present invention, for example, organic layers, light-emitting layers, cathode electrodes and the like of organic EL elements can be cited. In particular, the method for producing an organic semiconductor element of an embodiment of the present invention can be preferably used for production of R, G and B light-emitting layers of organic EL elements which require pattern precision with high definition.

(Method for Inspecting Vapor Deposition Mask)

Next, a method for inspecting a vapor deposition mask of an embodiment is described. The method for inspecting a vapor deposition mask of an embodiment is a method of irradiating a vapor deposition mask including a metal mask in which a slit is provided and a resin mask in which openings are provided at a position overlapping with the slit, the metal mask and the resin mask being stacked, with visible light, and performing appearance inspection of the openings provided in the resin mask on the basis of contrast between a region which transmits the visible light and a region which does not transmit or hardly transmit the visible light in the resin mask, wherein the vapor deposition mask irradiated with the visible light is the vapor deposition mask of an embodiment described above.

According to the method for inspecting a vapor deposition mask of an embodiment, since the vapor deposition mask used in the inspecting method is the vapor deposition mask including the resin mask having about 40% of light ray transmittance at a wavelength of about 550 nm, the contrast in tone of shade imaged can be enhanced, and inspection precision of the openings provided in the resin mask can be improved. For the vapor deposition mask, the vapor deposition mask of an embodiment described above can be used as it is, and detailed description thereof is omitted here.

The irradiation direction of visible light is not specially limited but irradiation with visible light may be performed from the metal mask side of the vapor deposition mask, or the irradiation with visible light may be performed from the resin mask side of the vapor deposition mask. A visible light irradiation apparatus is not limited but a conventionally known apparatus that can perform irradiation with visible light can be properly selected and used. The visible light used in the method for inspecting a vapor deposition mask of an embodiment is not specially limited but, for example, a light ray containing a component at a wavelength of about 550 nm, such as white light, can be cited.

As above, for the best mode in an embodiment of the present invention, the vapor deposition mask including the resin mask 20 having about 40% or less of light ray transmittance at a wavelength of about 550 nm and the vapor deposition mask preparation body for obtaining this vapor deposition mask, the method for producing an organic semiconductor element using this vapor deposition mask, and the method for inspecting the vapor deposition mask are described. In the case of setting the resin mask 20 containing the color material component as described for the aforementioned first device or the resin mask 20 including the color material layer 40 provided on the region not formed with openings as described for the aforementioned second device, as compared with the resin mask not containing the color material component and the resin mask not including the color material layer, the light ray transmittance at a predetermined wavelength can be reduced. The reduction of the light ray transmittance leads to improvement of inspection precision of the openings, and as compared with a conventional resin mask, inspection precision of the openings can be improved by a reduction in light ray transmittance.

Accordingly, a vapor deposition mask of another embodiment is characterized in that a resin mask contains a color material component or a color material layer is provided on the resin mask, not limited by the light ray transmittance of the resin mask at a wavelength of about 550 nm. It preferably contains a color material component and/or a color material layer that can reduce the light ray transmittance at a wavelength of about 550 nm. Moreover, for the frame-equipped vapor deposition mask, the method for producing an organic semiconductor element and the method for inspecting a vapor deposition mask described above, a vapor deposition mask including the resin mask having this feature can also be used. Moreover, a vapor deposition mask preparation body including the resin mask having this feature can also be set.

REFERENCE SIGNS LIST

100 Vapor deposition mask
10 Metal mask
15 Slit
16 Through hole
20 Resin mask
25 Opening
40 Color material layer
60 Frame
200 Frame-equipped vapor deposition mask

The invention claimed is:

1. A vapor deposition mask comprising: a metal mask having a slit and a resin mask having an opening corresponding to a pattern to be produced by vapor deposition at a position overlapping with the slit, the metal mask and the resin mask being stacked, wherein
    the resin mask has about 40% or less of light ray transmittance at a wavelength of about 550 nm.
2. The vapor deposition mask according to claim 1, wherein a thickness of the resin mask is about 3 μm or more and less than about 10 μm.
3. The vapor deposition mask according to claim 1, wherein the resin mask contains a color material component.
4. The vapor deposition mask according to claim 3, wherein a thickness of the resin mask is about 3 μm or more and less than about 10 μm.
5. A frame-equipped vapor deposition mask constituted by fixing a vapor deposition mask onto a frame, wherein
    the vapor deposition mask includes a metal mask having a slit and a resin mask having an opening corresponding to a pattern to be produced by vapor deposition at a position overlapping with the slit, the metal mask and the resin mask being stacked, and
    the resin mask has about 40% or less of light ray transmittance at a wavelength of about 550 nm.
6. A vapor deposition mask preparation body for obtaining a vapor deposition mask including a metal mask having a slit and a resin mask having an opening corresponding to a pattern to be produced by vapor deposition at a position overlapping with the slit, the metal mask and the resin mask being stacked, wherein the metal mask having the slit is provided is stacked on one surface of a resin plate, and the resin plate has about 40% or less of light ray transmittance at a wavelength of about 550 nm.

* * * * *